(12) United States Patent
Jensen

(10) Patent No.: US 6,880,262 B1
(45) Date of Patent: Apr. 19, 2005

(54) CONTINUOUS TIME ΔΣ ADC WITH DITHERING

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/676,320

(22) Filed: Sep. 30, 2003

(51) Int. Cl.[7] .............................................. H03M 1/12
(52) U.S. Cl. ........................ 34/155; 341/120; 341/143
(58) Field of Search ................................. 341/143, 155, 341/144, 118, 120, 131, 141, 142, 156, 158

(56) References Cited

U.S. PATENT DOCUMENTS

| | | | | |
|---|---|---|---|---|
| 6,346,898 B1 | * | 2/2002 | Melanson | 341/143 |
| 6,639,530 B2 | * | 10/2003 | Jensen et al. | 341/143 |
| 6,744,392 B2 | * | 6/2004 | Melanson | 341/143 |

* cited by examiner

*Primary Examiner*—Michael Tokar
*Assistant Examiner*—John B Nguyen
(74) *Attorney, Agent, or Firm*—Garlick Harrison & Markison, LLP; James A. Harrison

(57) ABSTRACT

The present invention employs a mixture of digital signal processing and analog circuitry to reduce spurious noise in continuous time delta sigma analog-to-digital converters (CTΔΣADCs). Specifically, a small amount of random additive noise, also referred to as dither, is introduced into the CTΔΣADC to improve linear behavior by randomizing and de-correlating the quantization noise from the input signal without significantly degrading the SNR performance. In each of the embodiments, digital circuitry is used to generate the desired randomness, de-correlation, and spectral shape of the dither and simple analog circuit blocks are used to appropriately scale and inject the dither into the CTΔΣADC loop. In one embodiment of the invention, random noise is added to the quantizer input. In another embodiment, a relatively small amount of current is randomly added or subtracted in the feedback loop to randomize and de-correlate the quantization noise from the input signal while maintaining required signal to noise ratios.

24 Claims, 24 Drawing Sheets

CONTINUOUS TIME ΔΣ ADC WITH DITHERING

BACKGROUND

1. Technical Field

The present invention relates to communication systems and, more particularly, analog-to-digital and digital-to-analog converters used within transceivers.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and licence operates, in accordance with one or more communication standards. For instance, wireless is communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution Sy stems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.) that performs analog signal processing tasks as a part of converting data to a radio frequency (RF) signal for transmission and a received RF signal to data.

As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more, local oscillations to convert the amplified RF signal into a baseband signal or an intermediate frequency (IF) signal. As used herein, the term "low IF" refers to both baseband and intermediate frequency signals.

A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

As an additional aspect, these designs are being pursued as a part of a drive to continually reduce circuit size and power consumption. Along these lines, such designs are being pursued with CMOS technology thereby presenting problems not addressed by prior art designs. For example, one common design goal is to provide an entire system on a single chip. The drive towards systems-on-chip solutions for wireless applications continues to replace traditionally analog signal processing tasks with digital processing to exploit the continued shrinkage of digital CMOS technology.

One approach of current designs by the applicant and assignee herein is to reduce analog signal processing performance requirements and to compensate for the relaxed performance requirements in the digital domain to provide required system performance. This approach is beneficial in that, in addition to the reduced silicon area requirements, the processing is insensitive to process and temperature variations.

Applications for which this trend is observed include RF receivers where the received signal is digitized as early as possible in the receiver chain using a high dynamic range analog-to-digital converter (ADC), and in a variety of calibration circuits of the radio where signal levels must be measured accurately over a wide range of values. This trend thus increases the demand for embedded low-power, low-voltage ADCs providing high dynamic range in the interface between the analog and digital processing.

A class of ADCs capable of providing high dynamic range and particularly suitable for low-power and low-voltage implementation is known as continuous-time delta sigma analog-to-digital converters (CTΔΣADCs). These ADCs can be designed to operate with supply voltages in the range 1.2V1.5V and current consumption as low as a few hundred $\mu$As.

FIG. 1 shows an example top-level block diagram of the simplest CTΔΣADC, namely the first-order lowpass CTΔΣADC. The input signal to the CTΔΣADC is a voltage source labeled s(t). An op-amp with negative capacitive feedback constitutes an integrator formed by the operational amplifier and capacitor in a feedback loop, which integrates the input current labeled $i_s(t)$ flowing from an input signal s(t) to produce an analog integrator output voltage. A coarse (in this example 2-bit) quantizer converts the analog integrator output voltage signal to a digital format shown as y(t). The quantizer, by providing a two-bit output, defines which of four voltage levels most closely match the analog integrator output voltage. More specifically, the quantizer produces a two-bit output having values of 00, 01, 10 and 11.

The quantizer consists of an array of comparators, essentially 1-bit ADCs, whose output is either "high" or "low"

depending upon the magnitude of the integrator voltage relative to a reference signal generated by a reference generator. A digital-to-analog converter (DAC) provides a feedback current responsive to a logic value ("1" or "0") of ADC output to the integrator. FIG. 2 shows one implementation of the 2-bit quantizer and the 2-bit feedback DACs. The quantizer sums the output values of the array of comparators to produce the two-bit output discussed above.

FIG. 3 shows an alternative model of the first-order CTΔΣADC of FIG. 1, wherein the quantizer has been replaced with an additive noise source q(t). The model of FIG. 3 is a model that represents the CTΔΣADC of FIG. 1. Because the operation of the quantizer is deterministic, a signal q(t) may be defined such that the CTΔΣADC of FIG. 3 behaves similarly to the CTΔΣADC of FIG. 1. The digital ADC output, here denoted y(t), can then be written as a sum of two terms, namely a term related to the input signal, $y_s(t)$, and a term related to the quantization noise, yq(t), i.e., $$y(t)=y_s(t)+y_q(t) \quad (1)$$

By employing feedback around the integrator and quantizer combination, it is possible to suppress the quantization noise component $y_q(t)$ in a limited frequency range around, DC.

Specifically, it can be shown that $y_q(t)$ results from q(t) being filtered by a first-order high-pass filter, commonly referred to as the noise transfer function, NTF(s), i.e., in terms of Laplace transforms, $$Y_q(s)=NTF(s) \times Q(s) \quad (2)$$

Similarly, for a low-frequency input signal s(t), it can be shown that the signal component $y_s(t)$ equals the input signal, i.e., in terms of Laplace transforms, $$Y_s(s)=S(s). \quad (3)$$

The above properties explain the terminology "lowpass" CTΔΣADC; if s(t) is a low-frequency input signal, the ADC output y(t) closely resembles s(t) when considering only the low-frequency region of y(t), i.e., the ADC "passes" signals of low frequency from analog to digital format without alteration. Furthermore, the lowpass CTΔΣADC of FIG. 1 is of first-order since the single integrator gives rise to a first order high-pass filters; more integrators can, in principle, be added to yield higher order filtering of the quantization noise as is described further below. Generally, an $N^{th}$ order CTΔΣADC contains N integrators.

Ideally, in equation (2), the quantization noise q(t) is uncorrelated with the input signal s(t) and closely resembles white noise of power $\Delta^2/12$, where Δ is the quantizer step size (see FIG. 2) as long as the input signal is limited such that the quantizer operates in the no-overload region. In this case, the two terms that constitute y(t) in equation (1) are uncorrelated, or, equivalently, $y_q(t)$ closely resembles white noise, uncorrelated with the input, and filtered by the high-pass filter NTF(s). In this case, since NTF(s) is deterministic, the power of the quantization noise measured over a given signal band-width, $f_c$, of the ADC output y(t) can be determined to using standard linear systems analysis as $$P_n = \int_{f=0}^{f=f_c} \frac{\Delta^2}{12} |NTF(e^{j2\pi f})|^2 \, df. \quad (4)$$

For a given known input signal power, $P_S$, the signal-to-noise ratio (SNR)— a measure of the quality of the analog-to-digital conversion process—can then be calculated a-priori according to $$SNR = \frac{P_s}{P_n}. \quad (5)$$

Some properties of the ideal CTΔΣADC where q(t) resembles white and random noise follow from (4) and (5). For a given fixed fi, which depends upon the particular application, the SNR depends upon the input as would be expected from a linear system with q(t) contributing constant noise power at the output. In other words, any change of signal power leads: to an identical change of SNR in the ADC output; suppose, for example, that the signal power is doubled, e.g., increases by 6 dB, it then follows from (5) that the SNR increases by 6 dB.

Being able to a-priori reliably predict the SNR of the analog-to-digital converted signal, as in equations (4) and (5), is extremely important in almost all applications. Having a-priori knowledge of the SNR delivered by the ADC to within tight tolerances allows system designers to quantify the performance and behavior of the overall system under a variety of different operating conditions. In practice, in order to produce the SNR needed for accurate digital processing of the input signal s(t), a digital filter is used to filter out frequency components above $f_c$ in the ADC output signal. As a result of this filtering process, the coarsely quantized output of the CTΔΣADC undergoes a significant increase in bit-resolution.

In practice, however, the above stated assumption that q(t) closely resembles white noise uncorrelated with the input s(t) does not hold true for simple CTΔΣADCs, i.e., for $I^{st}$ and $2^{nd}$ order architectures. Especially for DC or low-frequency inputs, the quantization noise is periodic, generating what is commonly referred to as spurious noise, or idle tones. In this case, q(t) is correlated with the input signal s(t), and the frequency spectrum of q(t) contains discrete tones whose frequencies and amplitudes depend upon the specific amplitude and frequency contents of the input. It follows from equation (2) that spurious tones will be observed in the output of the CTΔΣADC with amplitudes and frequencies that are input signal dependent in practice it is difficult, oftentimes impossible, to exactly predict where in the frequency spectrum the spurious noise appears, and small changes in the input may lead to large changes in the spurious noise. Particularly troublesome, sometimes components of the spurious noise may occur within the passband of the digital filter employed to filter out quantization noise beyond $f_c$, while at other times all spurious components fall beyond $f_c$. This leads to a very undesirable property of the A/D conversion process namely that strong peaks and dips in the power of the in-band portion of yq(t) are observed with strong peaks and dips in the SNR as a result. Unreliable and oftentimes unpredictable behavior of the overall system is an unavoidable result.

As examples of the un-predictable spurious behavior of the quantization noise of the first-order CTΔΣADC of FIG. 1 when driven by DC input, FIGS. 4–6 show the output power spectral density (PSD) of the ADC for the cases of DC inputs of 0.25V, 0.55V, and 0.80V, respectively, vs frequency (in MHz) As may be seen, an output y(t) includes tones, for a 0.25 VDC inputs as shown in FIG. 4, at 3 and 6 MHz. Attenuation of the tones at these frequencies is possible with a notch filter if the input voltage is a constant value and good SNR characteristics may be obtained. FIGS. 5 and 6, however, show that the tones change according to the voltage input level. As may be seen in FIG. 5, ten different tones occur in the 0–6 MHz frequency range for an input voltage of 0.55 VDC. As may be seen in FIG. 6, five tones occur in the 0–6 MHz frequency range for an input voltage of 0.80 VDC. Clearly, the number and frequency of the tones are dependent upon the input voltage level. Thus, a filter cannot easily be made that notches out all of these tones in an environment where the input voltage is not a constant level. Thus, a need exists for a modification, or enhancement, of the basic CTΔΣADC architecture to allow for substantially enhanced linear behavior by randomizing and de-correlating the quantization noise from the input signal without significantly degrading the SNR performance.

SUMMARY OF THE INVENTION

The present invention employs a mixture of digital signal processing and analog circuitry to substantially improve the linear behavior of the basic low-order CTΔΣADC architectures. Specifically, a small amount of random additive noise, also referred to as dither, is introduced into the CTΔΣADC to substantially enhanced linear behavior by randomizing and de-correlating the quantization noise from the input signal without significantly degrading the SNR performance. There are multiple embodiments of the invention for introducing dither to achieve this desired effect. Common to all of the embodiments is that digital circuitry is used to generate the desired randomness, de-correlation, and spectral shape of the dither and simple analog circuit blocks are used to appropriately scale and inject the dither into the CTΔΣADC loop.

A $1^{st}$ order CTΔΣADC 132 may be made according to the present invention with one of two options for dither injection. Generally, only one of the two options is typically used, though both could be used, in order to maintain desirable signal-to-noise (SNR) ratios. In one embodiment, a CTΔΣADC includes an integrator 134 that is coupled to receive an input signal $i_s(t)$ and produces an integrated analog output that is added to a dither signal and produced to an input node of a quantizer. Generally, selectable reference levels are used to create the dither that is injected into the quantizer input. A digital-to-analog converter (DAC) 140 is coupled to receive a digital output of quantizer 138 to convert the output back to an analog feeback signal to the integrator. In this first embodiment, two-level dither of amplitude $\Delta_d$ is injected at an input node of the quantizer and is subjected to the same spectral shaping function, NTF(s), as the quantization noise. Accordingly, the amplitude of the dither should be smaller than the quantizer step size in order not to significantly degrade the nominal SNR. The exact optimal amount of dither to inject in order to generate significantly improved linear behavior of the CTΔΣADC while not degrading SNR depends somewhat upon the specific properties of the circuit design and may readily be determined by one of average skill in the art following the teachings of the present invention.

In a second embodiment, a dither current signal is injected (sourced or sinked) at an output of the DAC and is added to the feedback signal produced to the integrator. In both embodiments, it is a general goal to shape the power spectral density of the noise away from the frequency of the signal of interest. In the first embodiment, random quantization noise added as a voltage signal desirably pushes the energy to the higher frequencies to create a high pass filtering function. In the second embodiment, random quantization noise is added as a current signal in a feedback path and is pushed away (on both sides) from a specified intermediate frequency (IF).

Other aspects of the present invention will become apparent will further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 7:
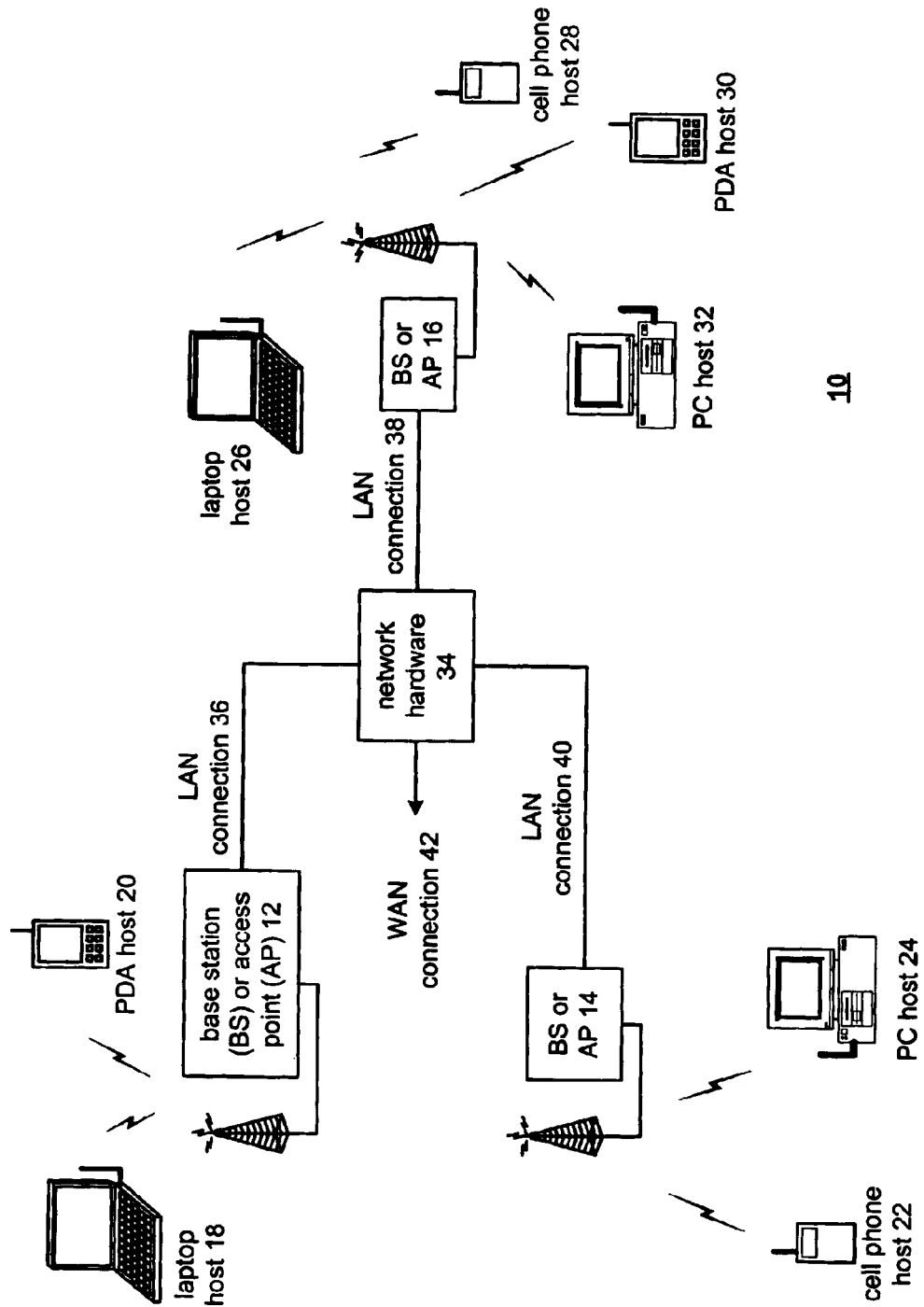
FIG. 7 is a functional block diagram illustrating a communication system that includes a plurality of base stations or access points (AP), a plurality of wireless communication devices and a network hardware component.

FIG. 7 is a functional block diagram illustrating a communication system 10 that includes a plurality of base stations or access points (AP) 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 8.

The base stations or AP 12–16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12–16 has an associated antenna or antenna array to communicate with the wireless communication devices in its area. Typically, the wireless communication devices 18–32 register with the particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 8:
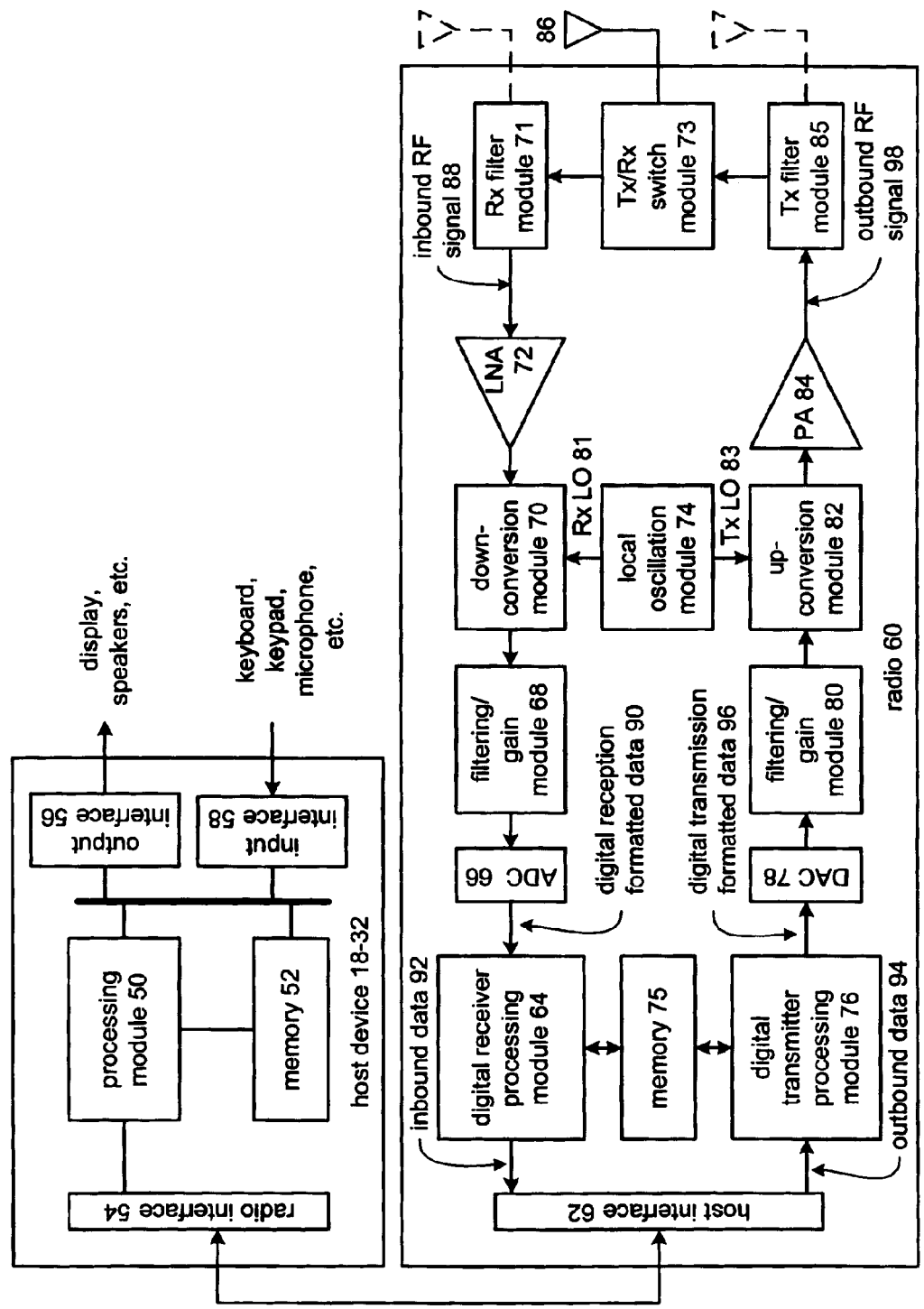
FIG. 8 is a schematic block diagram illustrating a wireless communication device as a host device and an associated radio.

FIG. 8 is a schematic block diagram illustrating a wireless communication device 18–32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18–32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route fit to the radio 60 via the radio interface 54.

Radio 60 includes a host interface 62, a digital receiver processing module 64, an analog-to-digital converter 66, a filtering/gain module 68, a down-conversion module 70, a a low noise amplifier 72, receiver filter module 71, a transmitter/receiver (TxIRX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, modulation. The digital receiver and transmitter processing modules 64 and 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18–32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. Local oscillation module 74 is, one embodiment of the invention, a multi-stage mixer as described herein.

The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. Local oscillation module 74 is, one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18–32 via the radio interface 54.

As one of average skill in the art will appreciate, the wireless communication device of FIG. 7 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 8 is one that may be implemented to include either a direct conversion from RF to baseband and baseband to RF or for a conversion by way of a low intermediate frequency. In either implementation, however, for an up-conversion module 82 and a down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband or RF by the up-conversion module 82 and down-conversion module 70, respectively. Accordingly, the local oscillation module 74 includes circuitry for adjusting an output frequency of a local oscillation signal provided therefrom. As will be explained in greater detail, below, the local oscillation module 74 includes a multi-stage that receives a frequency correction input that it uses to adjust an output local oscillation signal to produce a frequency corrected local oscillation signal output. While one embodiment of the present invention includes local oscillation module 74, up-conversion module 82 and down-conversion module 70 that are implemented to perform direct conversion between baseband and RF, it is understand that the principles herein may also be applied readily to systems that implement an intermediate frequency conversion step at a low is intermediate frequency.

Within a wireless communication device 18–32, as shown in FIG. 8, multiple applications for an ADC exist. First, a received RF must be converted to DC by an ADC such as ADC 66 for subsequent processing by a digital receiving processing module 64. Additionally, however, ADCs may also be used for providing signal magnitude and phase information to logic or to a processing module such as a front end processor for circuit calibration purposes.

Figure 9:
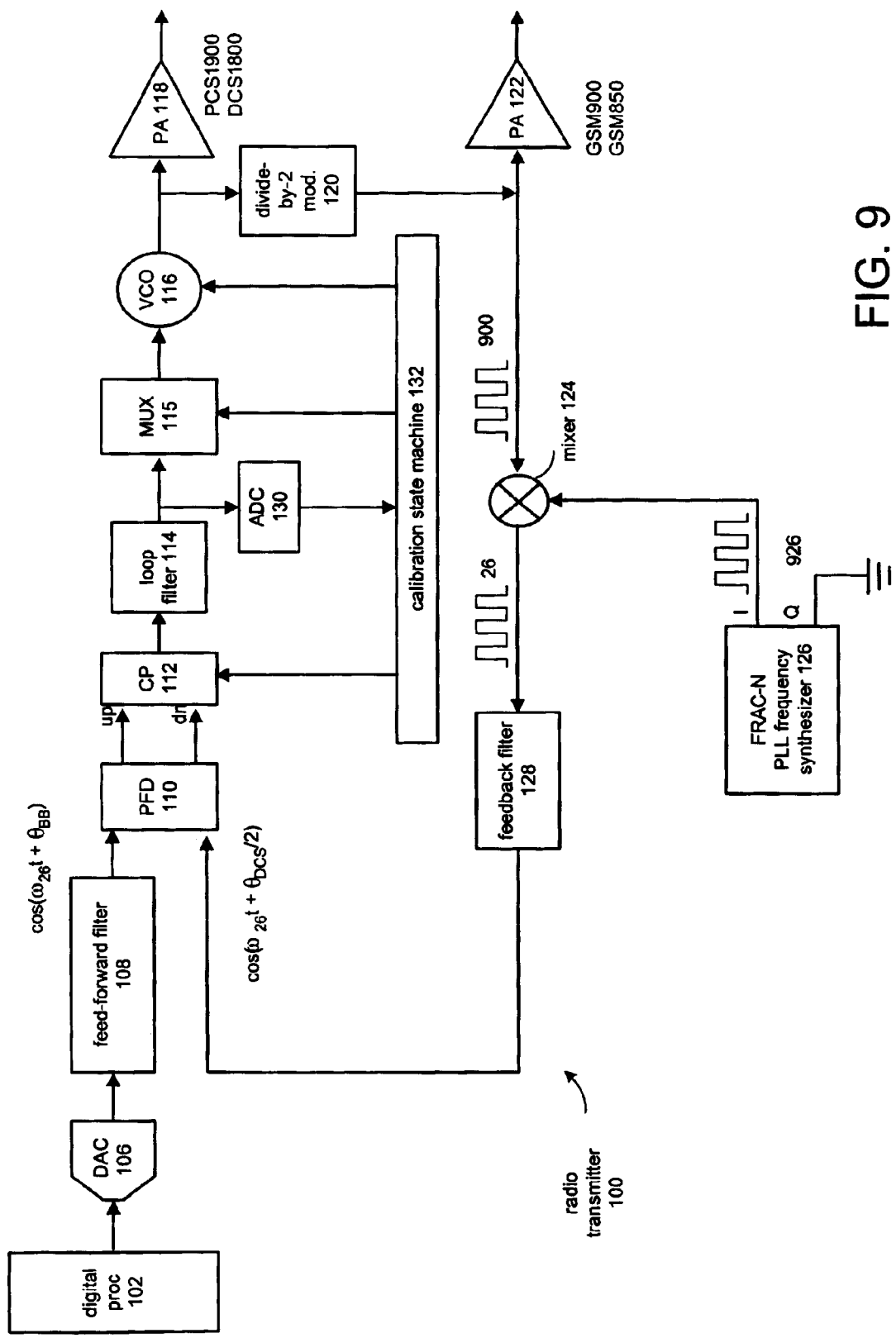
FIG. 9 is a functional block diagram of a radio transmitter employing an ADC according to one embodiment of the present invention for calibration purposes.

FIG. 9 is a functional block diagram of a radio transmitter employing an ADC according to one embodiment of the present invention for calibration purposes. A radio transmitter 100 includes a digital processor 102 that produces digital data that define a phase and a frequency of a phase modulated signal. A digital-to-analog converter module 106 is coupled to receive the digital data and produces a continuous waveform signal to a filter 108. Filter 108 produces a filtered analog signal as a reference signal to a phase frequency detector (PFD) 110. The digital rate is produced with a high sample rate such that, when converted to analog and filtered, an intermediate frequency (IF) signal is produced. The filtered signal, which may be represented as $\cos(\omega_{26} t + \theta_{BB})$, is a continuous waveform signal having a frequency of 26 MHz. The frequency of oscillation is 26 MHz, though the output frequency is a function of the digitized IF signal produced by digital processor 102. Not only is the frequency of the filtered IF signal produced by filter 108 determined by digital processor 102, but also the phase as defined by in-phase and quadrature component values. Accordingly, when radio transmitter 100 is a GSM transmitter, digital processor 102 further defines a phase of the filtered IF signal ($\theta_{BB}$) as a part of phase modulating the signal that is ultimately radiated as a radio frequency transmit signal.

Figure 4:
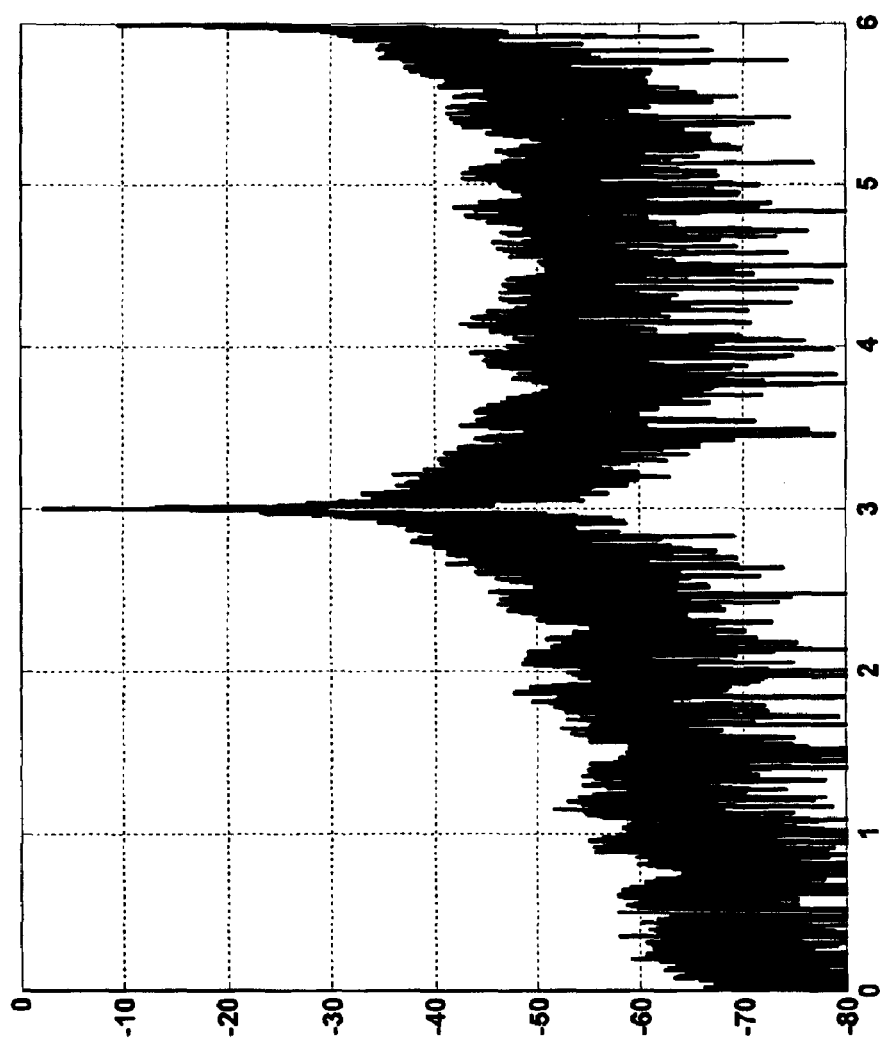
FIGS. 4, 5 and 6 show the output power spectral density (PSD) of the ADC for the cases of DC inputs of 0.25V, 0.55V, and 0.80V, respectively, vs. frequency (in MHz)

Alternatively, the digital data may be produced at a sample rate such that, when converted to analog and filtered, produces one of a baseband or low IF signal. Circuits for upconverting the baseband or low IF signal are known. Regardless of the frequency of the filtered analog signal, the PFD 110 of FIG. 4 receives the filtered analog signal and produces control signals to a charge pump (CP) 112 that, responsive to the control signals, produces a corresponding error current signal. A loop filter 114 is coupled to receive the error current signal and to produce a corresponding error voltage signal to a MUX 115 that, in turn, produces' the error voltage signal to a voltage controlled oscillator (VCO) 116. MUX 115 is present, in the described embodiment, to pass the control voltage to the VCO in normal operation and, while in a calibration mode, to pass a constant level voltage to the VCO input. The VCO 116 produce's an oscillation, which here also is the RF transmit signal. In the described embodiment, the RF transmit signal produced by VCO 116 is produced to a power amplifier 118 for amplification and radiation from an antenna.

In the specific embodiment of FIG. 9, radio transmitter 100 is a GSM-based radio transmitter. Accordingly, the output oscillation or carrier frequency of the RF transmit signal produced by VCO 116 is equal to one of 1800 or 1900 MHz. Power amplifier 118 then receives the 1800 or 1900 MHz GSM phase modulated signal for amplification. Within the GSM domain, however, other frequencies of interest are 850 and 900 MHz. Accordingly, as may be seen, a divide-by-2 module 120 is coupled to receive the RF transmit signal produced by; VCO 116 and produces one of a 900 MHz signal or an 850 MHz signal according to whether the RF transmit signal was a 1900 MHz signal or an 1800 MHz signal. The output of divide-by-2 module 120 is then received by power amplifier 122 that amplifies the signal for propagation from an antenna.

For the purposes of the present example, assume that VCO 116 produces an output frequency oscillation of 1800 MHz as the RF transmit signal. Accordingly, divide-by-2 module 120 produces a 900 MHz signal to power amplifier 122. The 900 MHz signal is further produced to a mixer 124 that is further coupled to receive a 926 MHz signal from a FRAC-N phase locked loop (PLL) frequency synthesizer 126. As is known by one of average skill in the art, mixer 124 multiplies or mixes the two input signals, here 900 MHz and 926 MHz, to produce a 26 MHz output signal. The 26 MHz output signal is produced to a feedback filter 128 that filters the 26 MHz signal to produce a 26 MHz feedback signal that may be represented as $\cos(\omega_{26} t+\theta_{DCS}/2)$. The feedback signal is produced to PFD 110 that compares the phase of the feedback signal to the filtered IF signal (the reference signal) to cause the output phase of the RF transmit signal produced by VCO 116 to track the phase of the filtered IF signal that was produced from the digitized IF signal generated by digital processor 102.

In analyzing the feedback signal produced by feedback filter 128, one may note that the frequency is 26 MHz for the described embodiment. Additionally, the phase modulation index, represented by $\theta_{DCS}/2$, generally illustrates that the phase modulation index has been divided: by 2. This phase modulation index is divided by 2 by the divide-by-2 module 120. Divide-by-2 module 120 not only divides the frequency by 2, but also the phase modulation index. Accordingly, as will be described in greater detail below, digital processor 102 selectively adjusts the phase modulation index according to whether the RF transmit signal is output before or after the divide-by-2 module 120. More specifically, if the RF transmit signal is amplified and propagated by power amplifier 118, then digital processor 102 adjusts the phase modulation index by one-half. If power amplifier 118 is turned off and the RF transmit signal is divided by 2, and the phase modulation index is divided by 2, by divide-by-2 module 120, prior to amplification and transmission from power amplifier 122, digital processor 102 does not adjust the phase modulation index.

Above it was mentioned that FRAC-N PLL frequency synthesizer 126 produces a 926 MHz signal to mixer 124. The output of mixer 124, therefore, is a 26 MHz signal. It is understood, of course, that the output frequency provided by FRAC-N PLL frequency synthesizer 126 will be a function of the output frequency provided by the divide-by-2 module 120. As is known by one of average skill in the art, a mixer, such as mixer 124, will output a frequency reflecting a difference of the two input frequencies. Accordingly, the frequency of FRAC-N PLL frequency synthesizer 126 is selected so that, when mixed with the output of divide-by-2 module 120, a desired frequency feedback signal (here, 26 MHz) is produced to feedback filter 128.

Figure 3:
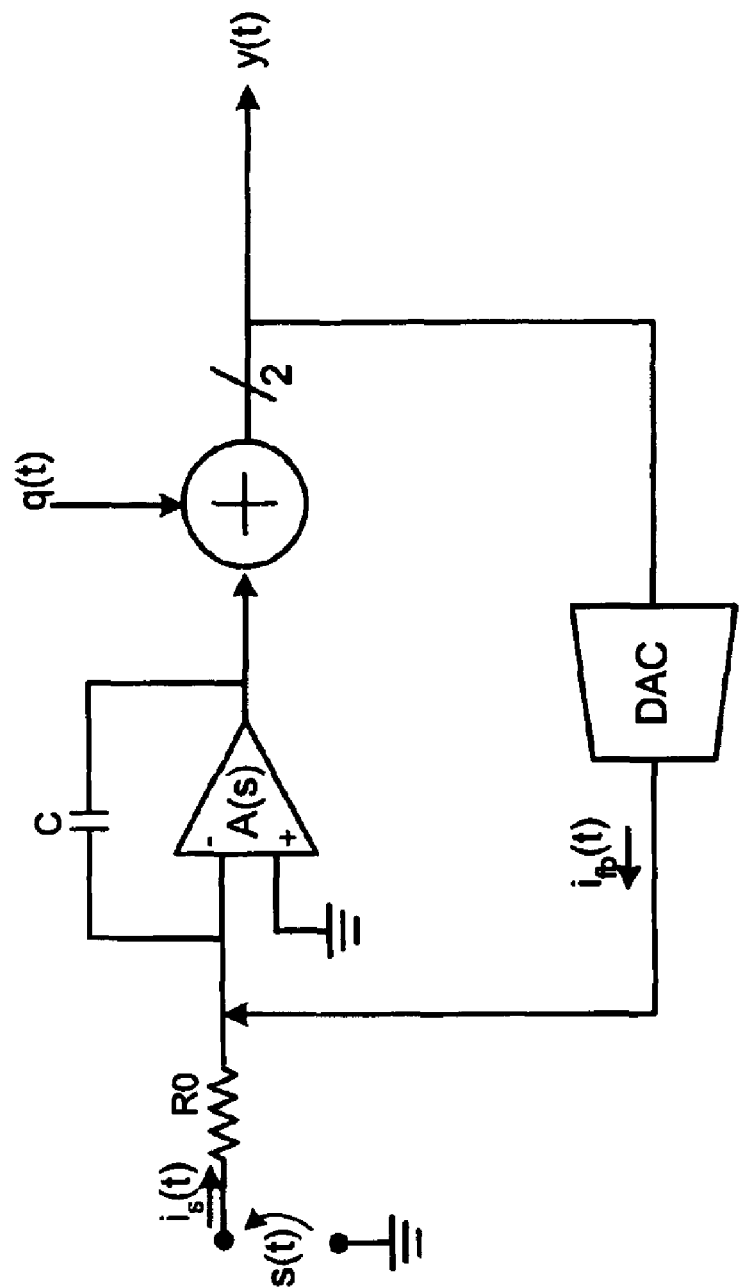
FIG. 3 shows an alternative model of the first-order CTΔΣADC of FIG. 1, wherein the quantizer has been replaced with an additive noise source q(t)

An ADC 130, formed according to one embodiment of the present invention, also is coupled to receive the output error voltage signal of loop filter 114. ADC 130 converts the error voltage signal to a digital signal that is produced to a calibration state machine 132 that, based upon the digital signal produced by ADC 130, generates control signals to at least one of CP 112, MUX 115 and VCO 116 to adjust operation of the translational loop of FIG. 3. Operation of calibration state machine 132 is described herein to illustrate one potential application of an inventive ADC such as ADC 130. Generally, low order ADCs having wide dynamic range as disclosed herein may be used through a system for converting analog signals to digital for use in signal process control. As will be described in greater detail below, ADC 130 injects dither !into the ADC circuitry to create a small amount of randomness in the quantization noise to reduce the frequency and magnitude of tones in the output of the ADC.

Figure 10:
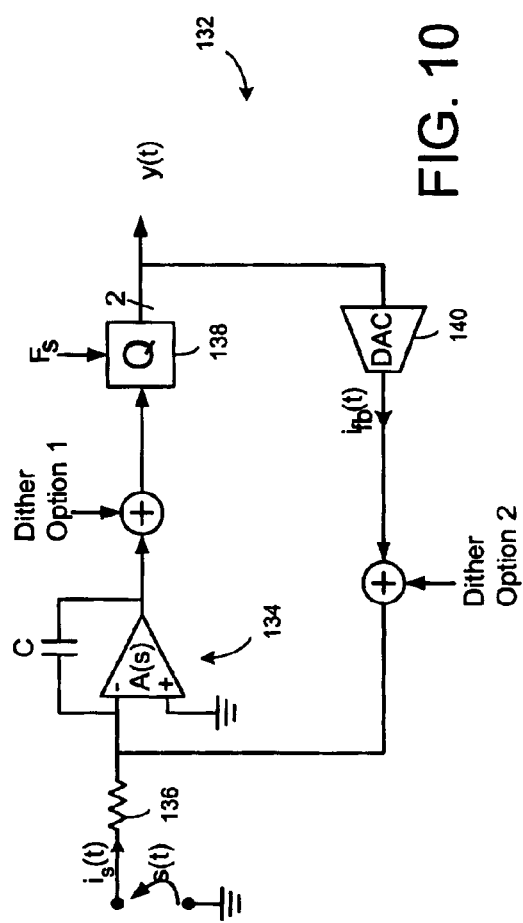
FIG. 10 illustrates a $1^{st}$ order CTΔΣADC 132 having two options for dither injection.

FIG. 10 illustrates a $1^{st}$ order CTΔΣADC 132 having two options for dither injection. Generally, only one of the two options is typically used, though both could be used, in order to maintain desirable signal-to-noise (SNR) ratios. As may be seen, CTΔΣADC 132 includes an integrator 134 that is coupled to receive an input signal $i_s(t)$ from a resistor 136. Integrator 134 produces an integrated analog output that is added to a dither signal (if option 1 is implemented) and produced to an input node of quantizer 138. The design for injecting dither is different according to the selected option as will be described in greater detail below. A digital-to-analog converter (DAC) 140 is coupled to receive a digital output of quantizer 138 to convert the output back to an analog feeback signal to integrator 134. In option 1, two-level dither of amplitude $\Delta_d$ is injected at an input node of a quantizer 134 of CTΔΣADC 132 and is subjected to the same spectral shaping function, NTF(s), as the quantization noise. Accordingly, the amplitude of the dither should be smaller than the quantizer step size in order not to significantly degrade the nominal SNR. The exact optimal amount of dither to inject in order to generate significantly improved linear behavior of the CTΔΣADC 132 while not degrading SNR depends somewhat upon the specific properties of the circuit design and may readily be determined by one of average skill in the art following the teachings of the present invention. In option 2, a dither signal is injected at an output of DAC 140 that is added to the feedback signal produced to integrator 134.

In both options, it is a general goal to shape the power spectral density of the injected noise away from the frequency of the signal of interest. In the case of option 1, random noise added as a voltage signal at the quantizer input. It follows from the previous description of the Noise Transfer Function, NiT(s), that the loop pushes the energy to the higher frequencies to create a high pass filtering function. In the case of option 2, random noise is added as a current signal in a feedback path and is pushed away from the desired input signal by digital modulation, the details of which will be explained later.

The quantizer noise of the ADC of FIG. 10 produces noise that are subject to a hi-pass shaping function which therefore allows for successful filtering by a digital or other filter. As mentioned herein, it is desirable to have random quantizer noise as the input q(t). Injection of random noise results in high-pass shaping such that most quantization noise energy is pushed to to higher frequencies and may therefore be filtered.

Figure 1:
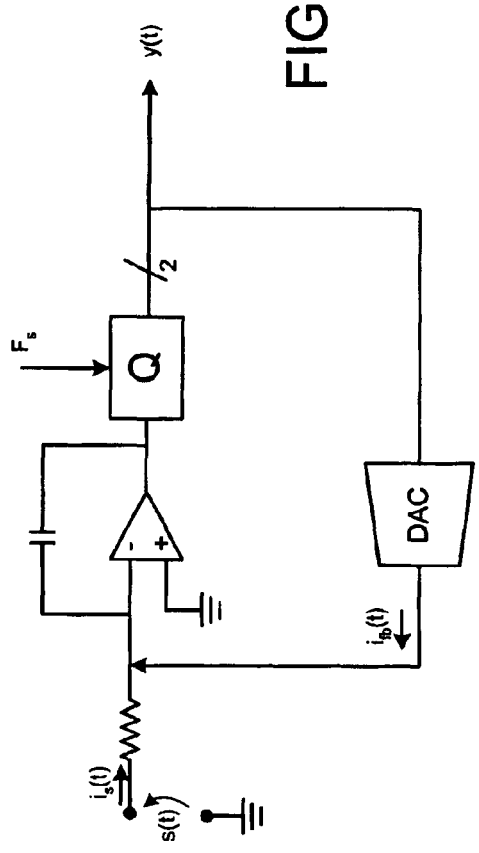
FIG. 1 shows an example top-level block diagram of the simplest CTΔΣADC, namely the first-order lowpass CTΔΣADC.
Figure 2:
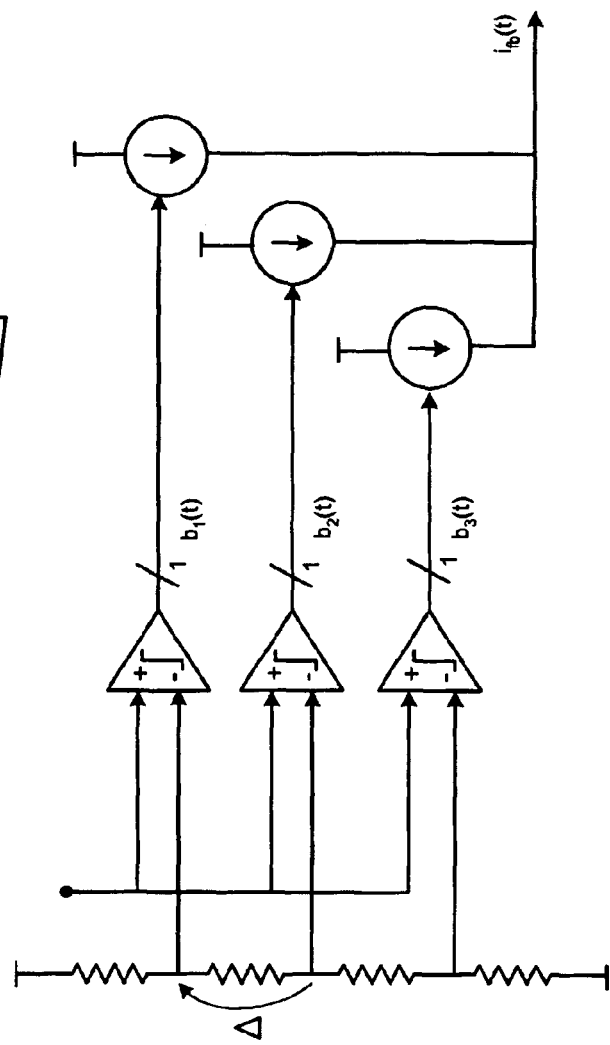
FIG. 2 shows one implementation of the 2-bit quantizer and the 2-bit feedback DACs.
Figure 12:
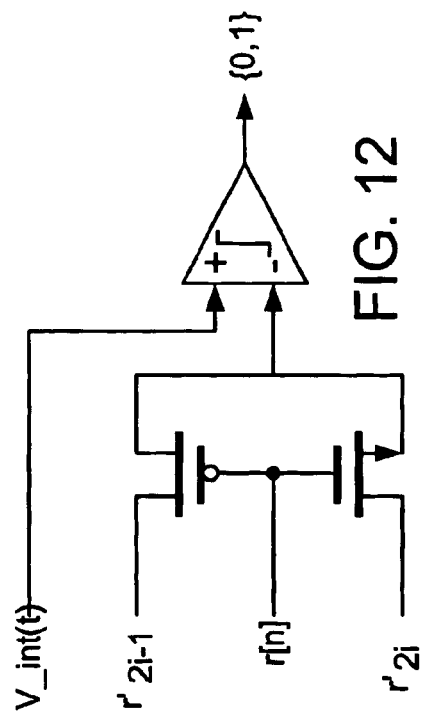
FIG. 12 shows the diagram of an analog MUX in conjunction with an $i^{th}$ comparator.
Figure 11A:
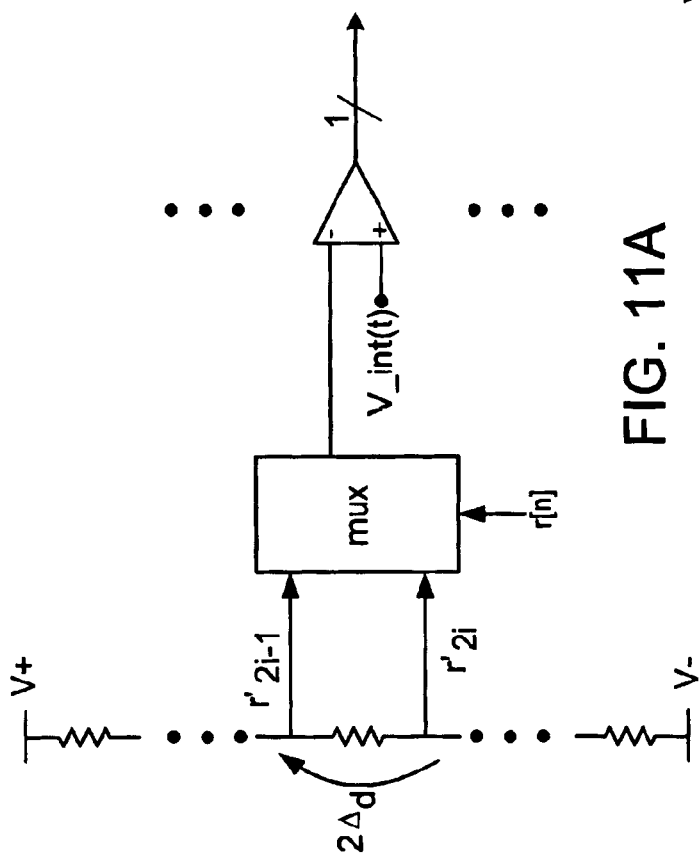
FIGS. 11A and 11B show details of the dither injection mechanism for an option 1 wherein a dither is randomly injected as a voltage signal at the quantizer.
Figure 11B:
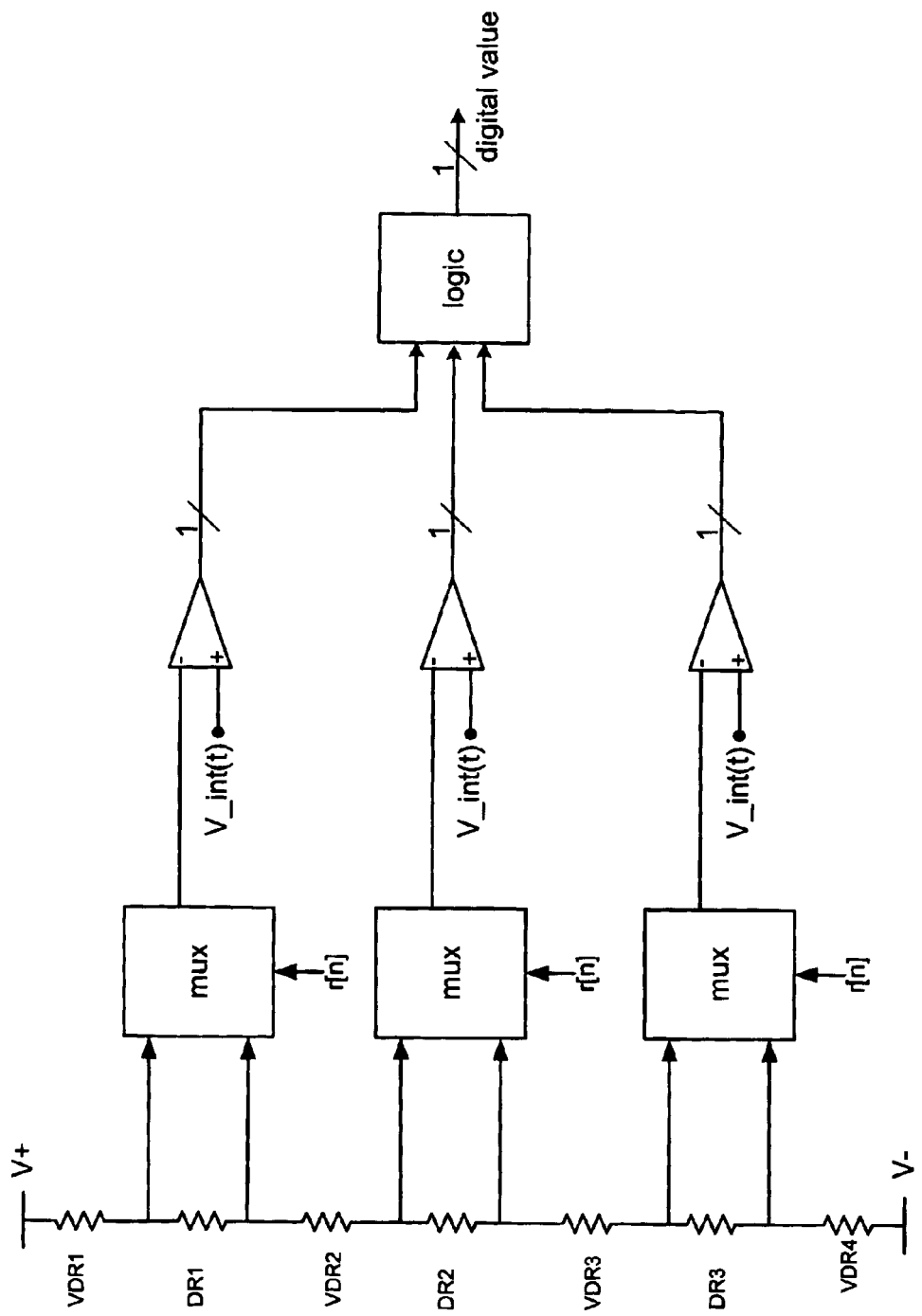

FIGS. 11A, 11B and 12 show details of the dither injection mechanism for option 1 according to one embodiment of the invention. In this option, dither is randomly injected as a voltage signal at the quantizer. Recall that, as shown by the 2-bit example in FIG. 2, a multi-bit quantizer is constructed as an array of single-bit quantizers, or comparators, that compare the quantizer input voltage to a known reference voltage specific to each comparator. If the input is greater than the reference voltage, the comparator outputs a "1", otherwise it outputs a "0". The reference generator that generates the reference voltages for the quantizer not only defines reference levels for producing digital values corresponding to analog signal magnitudes, but also provides varied reference levels in order to provide dither. To provide varied voltage levels for dither injection, the reference generator is modified to generate 6 reference levels, $r_1'$ ... $r_6'$, rather than the usual 3 reference levels, $r_1$ ... $r_3$, as shown in FIG. 2, for an ADC that can provide such that $$r_{2i-1}' = r_i - \Delta_d \text{ and } r_{2i}' = r_i + \Delta_d, i=1 \ldots 3 \tag{6}$$

Generally, in the described embodiment of the invention, the values of the resistors are not equal. The values of the resistors in between the inputs of the MUXs is typically significantly smaller than the values of the resistors that traditionally set the voltage level inputs to the comparator. One reason for this is to create a magnitude of the dither that is relatively small in contrast to the signal levels that define threshold levels in the ADC in order to maintain higher SNR ratios. Stated differently, using relatively small values of resistance for creating the dither relative to the resistor values of the remaining resistors results in the remaining resistors substantially defining the threshold levels for the ADC. Thus, noise introduced by the dither does not significantly degrade SNR for the ADC. To illustrate, in FIG. 11B, four voltage divider resistors VDR1–VDR4 are shown to define the significant voltage drops between a supply and ground. In between each of the voltage divider resistors, however, there is a relatively small resistor, shown as DR1–DR3, for dropping a relatively small dither voltage. As may be seen, a multiplexer is coupled across each dither resistor to select a reference voltage that is to be provided to a corresponding comparator based upon a pseudo-random sequence bit stream. In the described embodiment, there is an equal number of dither resistors, multiplexers and comparators within the ADC. Each multiplexer is coupled to receive a bit output from a pseudo-random bit stream to select a voltage drop from the two sides of the corresponding dither resistor based upon the bit output.

In operation, as the pseudo-random sequence bit stream changes values, each multiplexer will change the selected voltage from one side of a dither resistor DR1–DR3 to another to provide a slightly different reference as a reference level to the corresponding comparator. As each multiplexer receives the same bit output r[n] from the pseudo-random bit stream generator (not shown in FIG. 11B). As such, the reference level provided to the comparitor fluctuates by an amount that is equal to the voltage drop across the dither resistors as the pseudo-random sequence changes values.

More specifically, during operation, the quantizer randomly applies reference level $r'_{2i-1}$ or reference level $r'_{2i}$ to the reference input of the $i^{th}$ comparator using an analog MUX controlled by a pseudo-random bit sequence r[n] clocked at the quantizer clock rate. FIG. 12 shows the diagram of the analog MUX in conjunction with the $i^{th}$ comparator. All 3 MUXes of the quantizer for the shown embodiment are controlled by the same random bit sequence. It follows from the definition of the quantizer operation that this method effectively injects zero-mean random dither of amplitude 4 every clock cycle.

Figure 5:
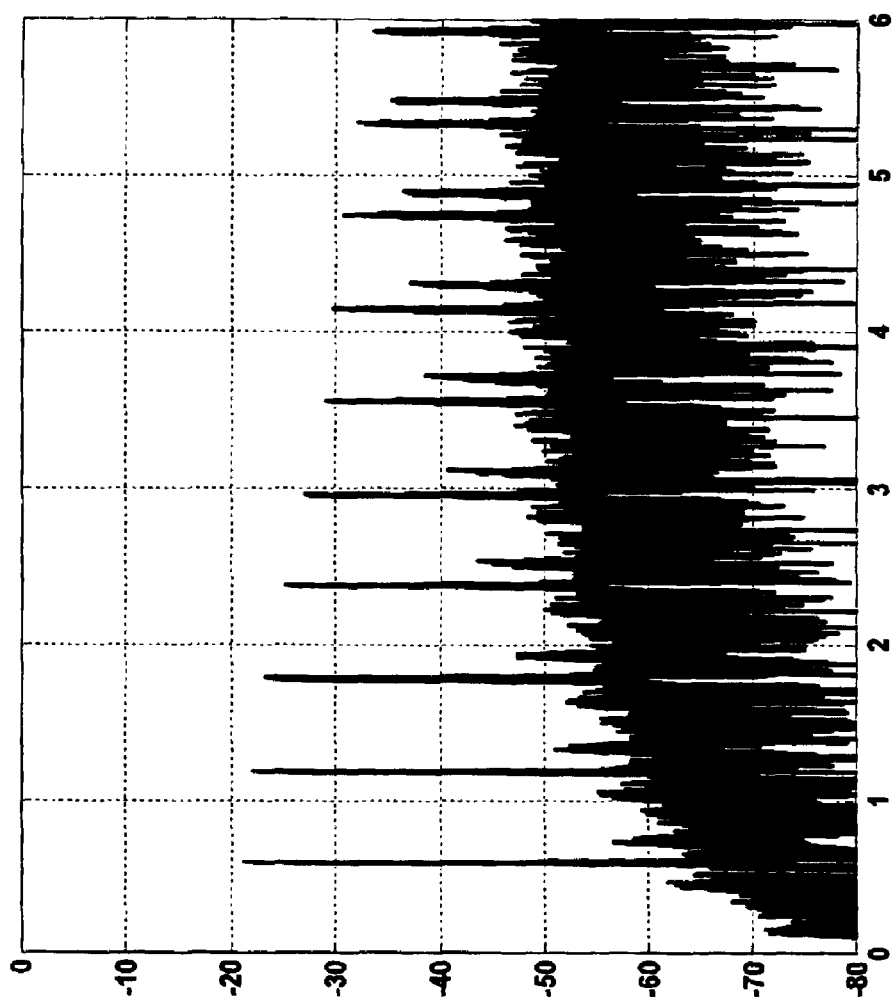
Figure 6:
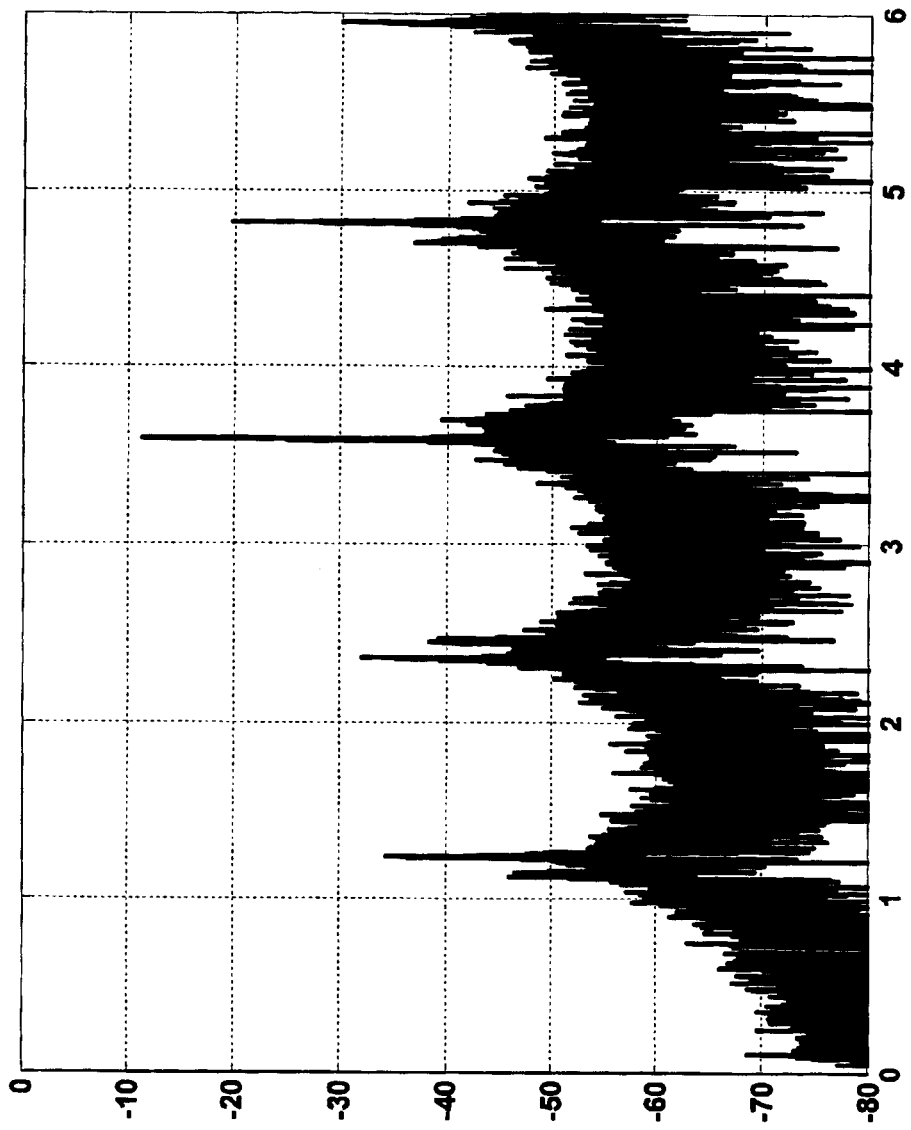
Figure 13:
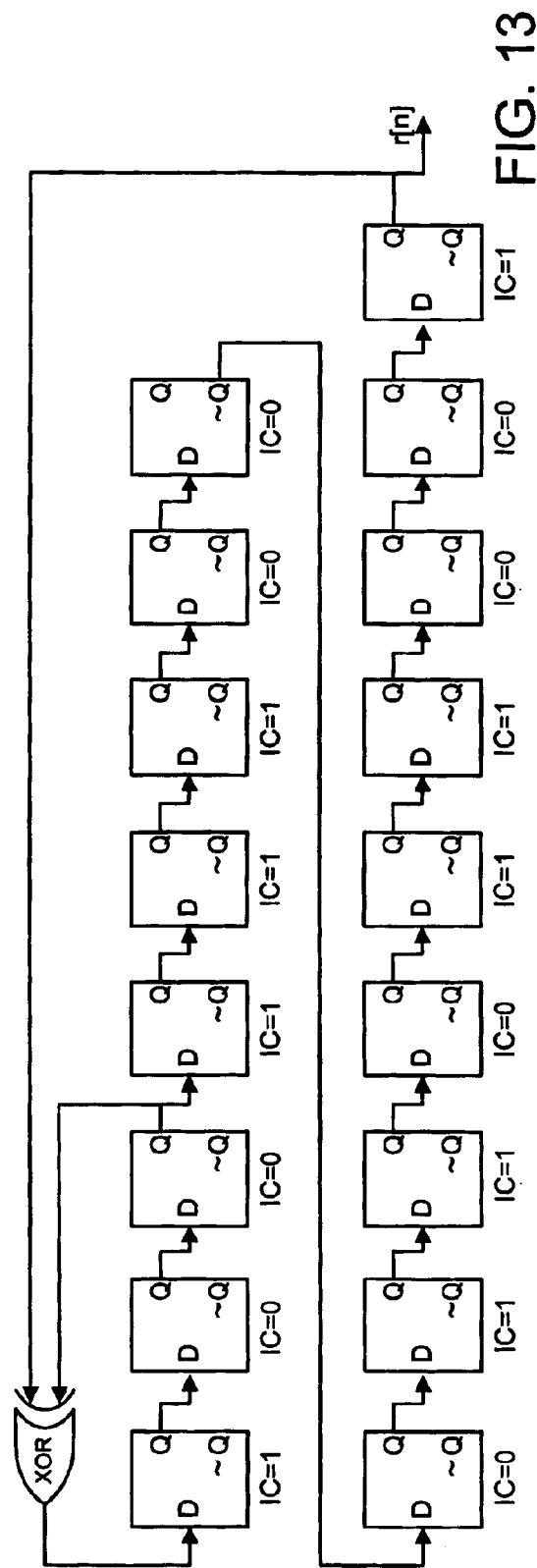
FIG. 13 shows the register level implementation of an example hardware efficient pseudo-random bit generator.
Figure 14:
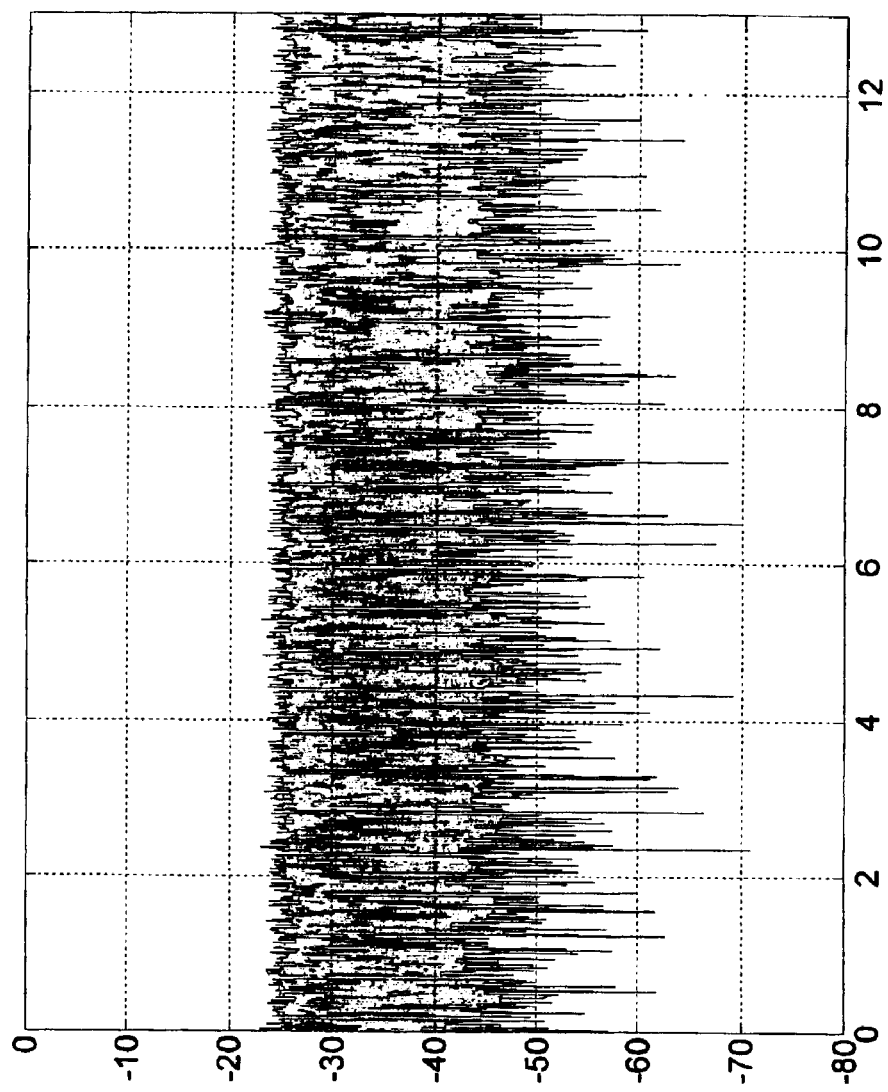
FIG. 14 shows typical power spectral densities of the dither effectively injected into the quantizer node by this method.

FIG. 13 shows the register level implementation of an example hardware efficient pseudo-random bit generator. This structure is also known as a linear feedback shift register (LFSR). The LFSR consists of 17 flip-flops and an exclusive-or gate. The Figure indicates the initial conditions (IC=0 or 1) for each of the registers. The initial condition is arbitrary as long as it is not zero for all registers. FIG. 14 shows typical power spectral densities of the dither effectively injected into the quantizer node by this method. As may be seen, the PSD of the dither effectively is white noise without a significant number of tones as was evident in the PSD diagrams of FIG. 4-6. Accordingly, the randomness of the LFSR of FIG. 13 is adequate for purposes of causing the reference levels provided to the comparators to fluctuate sufficiently to avoid or reduce tones in the output of the CTΔΣADC.

Figure 15:
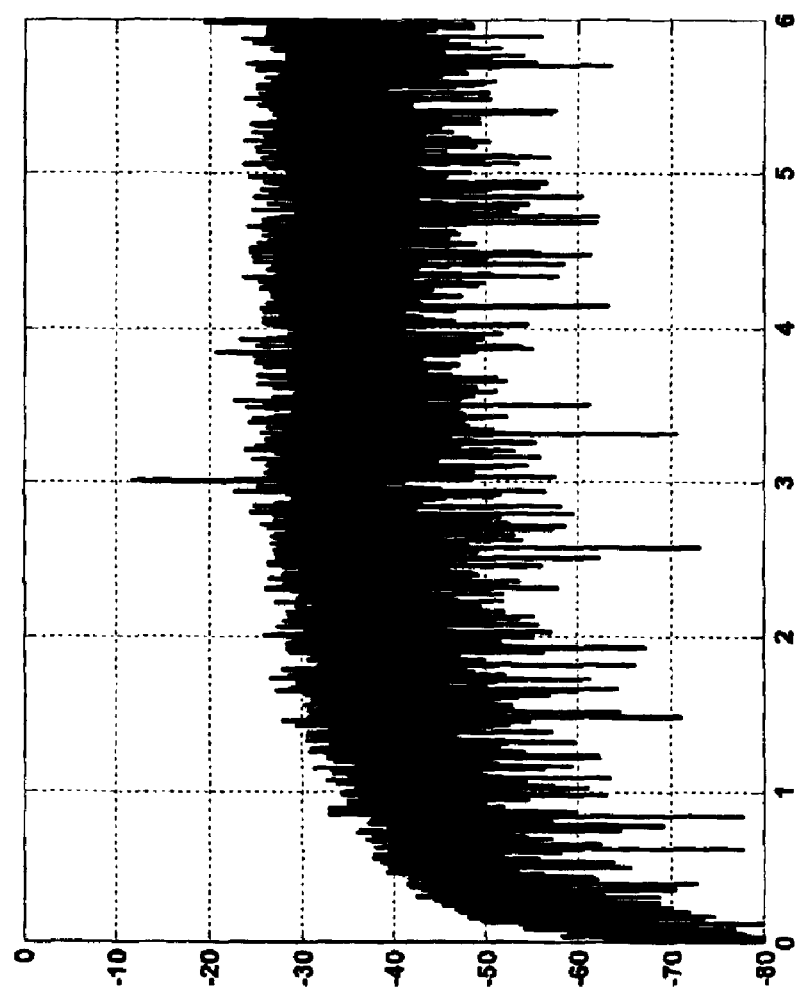
FIGS. 15–17 demonstrate the effectiveness of option 1 of the present invention in randomizing the quantization noise.
Figure 16:
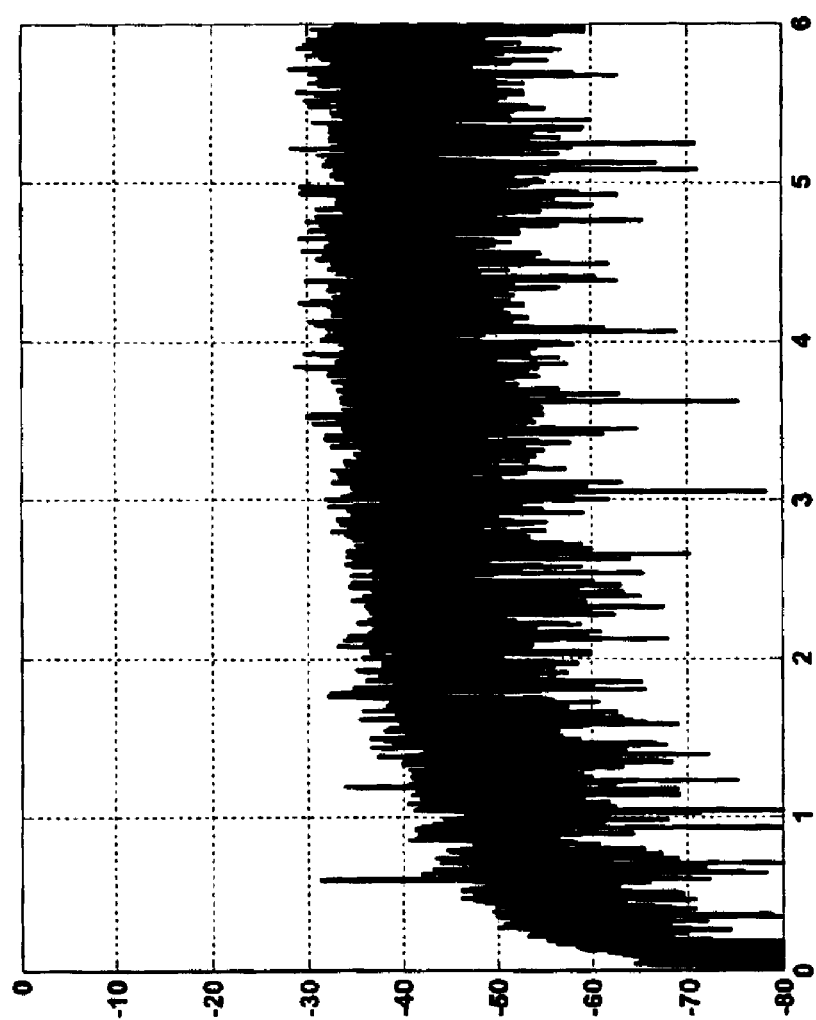
Figure 17:
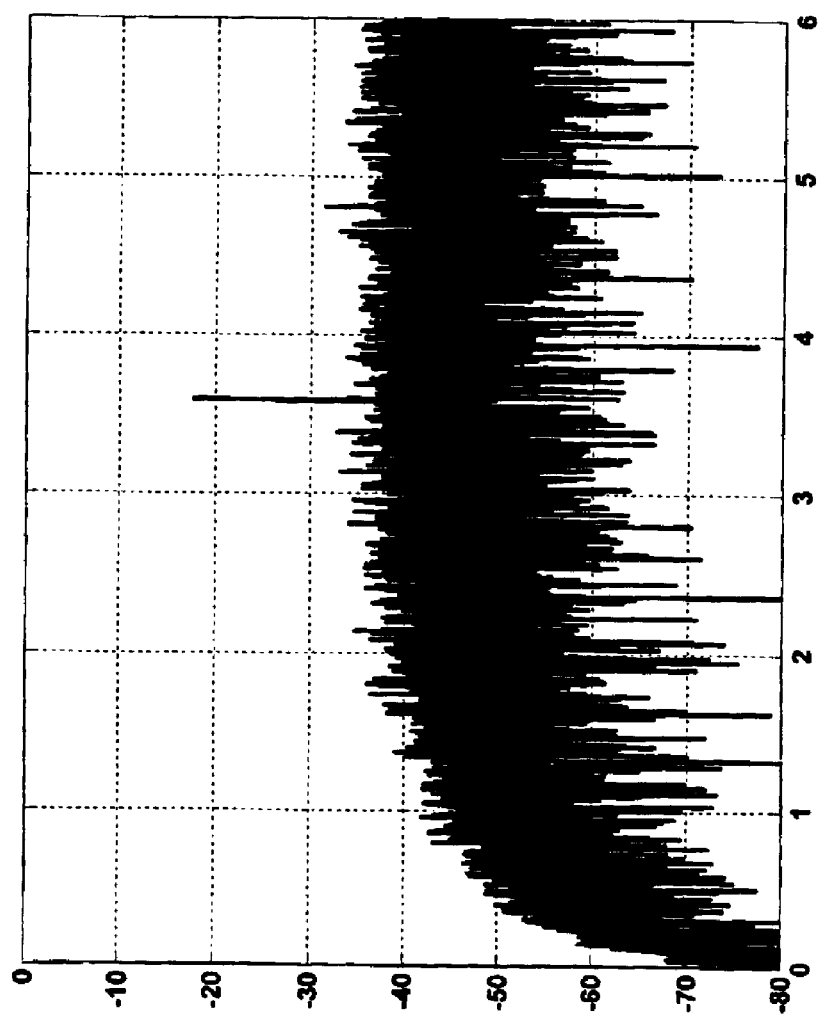

FIGS. 15–17 demonstrate the effectiveness of option 1 of the present invention in randomizing the quantization noise. Specifically, the CTΔΣADC of FIG. 10 employing dithering according to option 1, was driven by the same DC input signals as in FIGS. 4–6. In all cases, the spurious content of the quantization noise is strongly attenuated and the random nature of the quantization noise is highly independent of the particular input signal.

In option 2, as mentioned in relation to FIG. 10, a two-level dither current of amplitude $\Delta_d$ is injected in the feedback path of the CTΔΣADC. The dither signal here is a current rather than a voltage as in option 1. It should be noted that the dither here is not subjected to the same spectral shaping function, NTF(s), as the quantization noise. Hence, in order not to degrade SNR significantly, the amplitude of the dither must not only be well controlled in amplitude but its spectral content must be biased according to a high-pass filter similar to NTF(s). As with option 1, the optimal dither amplitude to cause significantly improved linear behavior of the CTΔΣADC 132 while not degrading SNR depends somewhat upon the specific properties of the circuit design and is best found by simulation and/or experimentation.

Figures 18, 19:
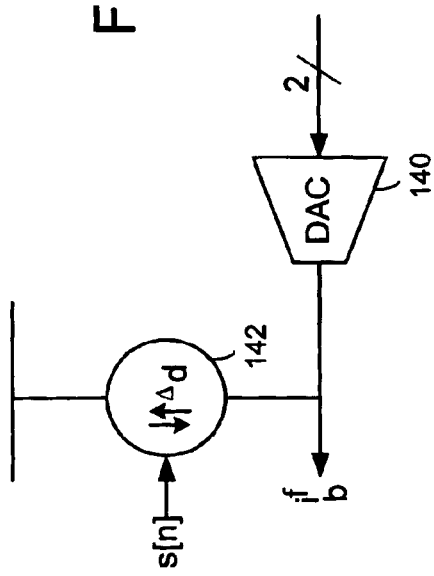
FIG. 18 shows details of the dither injection mechanism for option 2.
FIG. 19 shows a register level block diagram of a circuit appropriate for generating the digital control signal s[n] based on a received pseudo-random sequence wherein the digital control signal s[n] is characterized with a high pass shape.

FIG. 18 shows details of the dither injection mechanism for option 2. An extra two-level current source 142 is added to the feedback signal $i_s(t)$ produced by DAC 140. Current source 142 is controlled by a digital sequence s[n] such that if s[n]=1, a positive current of magnitude $\Delta_d$ is added to the feedback signal, and if s[n]=0 a negative current of magnitude $\Delta_d$ is added to the feedback signal (current is sinked from the output). In the described embodiment of the invention, the digital sequence includes logic to generate a pseudo-random sequence r[n] generated by a pseudo-random sequence bit stream generator.

FIG. 19 shows a register level block diagram of a circuit appropriate for generating the digital control signal s[n] based on a received pseudo-random sequence wherein the digital control signal s[n] is characterized with a high pass shape. This high pass shape illustrates that the random noise is not added at a frequency of interest in order to maintain desirable SNR ratios. A pseudo-random sequence is presented to an inverter 142, an AND gate 144 and an OR gate 146. The output of inverter 142 is presented to an AND gate 148 and to an OR gate 150. The outputs of AND gates 144 and 148 are presented to the two inputs of a J/K flip flop 152. The Q and ~Q outputs of J/K flip flop 152 are presented to OR gates 150 and 146, respectively. The outputs of OR gates 150 and 146 are presented to J/K flip flop 154. The Q output of J/K flip flop 154 is the output s[n]. The ~Q output of J/K flip flop 154 is presented to AND gate 148 while the Q output of J/K flip flop 154 is presented to AND gate 144. The circuit of FIG. 19 generates a bit sequence s[n] such that $$s[n]=r[n-1], s[n+1]=\sim s[n], s[n+2]=r[n+1], s[n+3]=\sim s[n+2], \quad (7)$$

Figure 20:
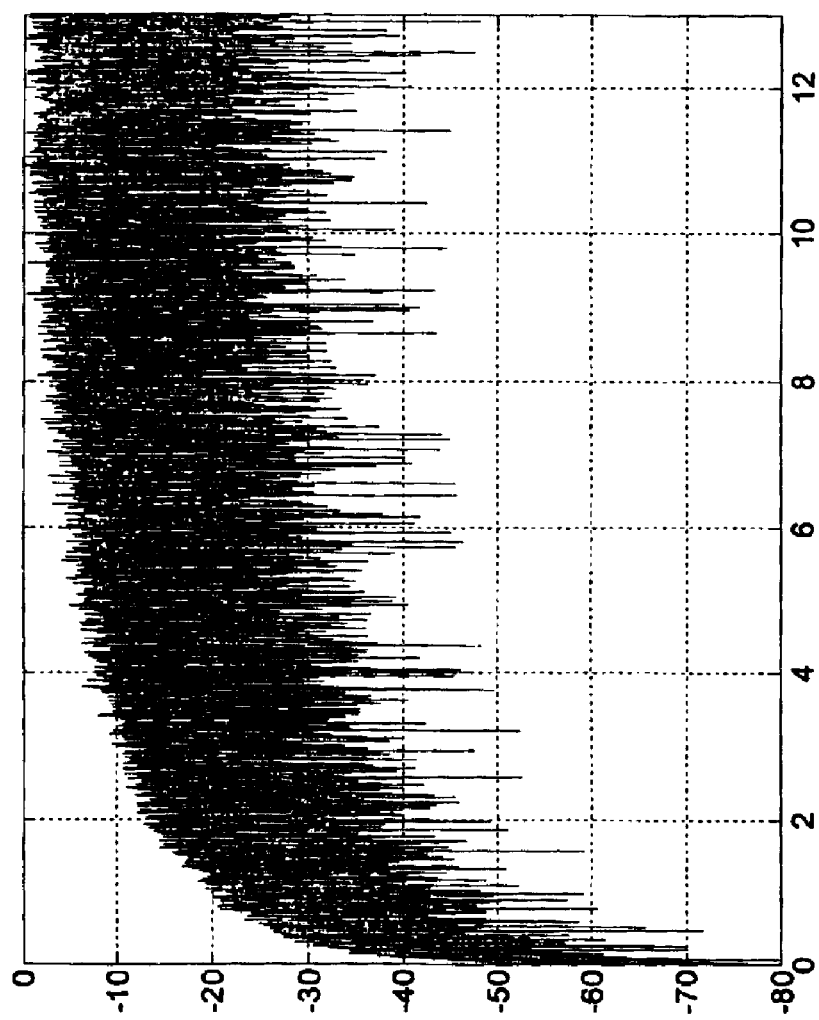
FIG. 20 shows a typical power spectral density of the dither effectively injected into the quantizer node by the method described as option 2.

The bit sequence s[n] as defined in (7) represents a pseudo-random bit-sequence with spectral highpass shaping as shown in FIG. 20 and may be represented as:

$$\Phi_{ss}(e^{j\omega})=|H(e^{j\omega})|\Phi_{rr}(e^{j\omega}), \quad (8)$$

where H denotes the first order highpass filter $$H(z)=1-z^{-1} \quad (9)$$

FIG. 20 shows a typical power spectral density of the dither effectively injected into the quantizer node by the method described as option 2. The highpass shaping property of the circuit in FIG. 19 may clearly be observed. Generally, the spectral contents of current follows a high pass shaped noise source to add random quantization noise without unduly affecting the SNR of the signal. As stated before, because the noise is added to a feedback current, the noise is desirably added away from the signal of interest frequency.

Figure 21:
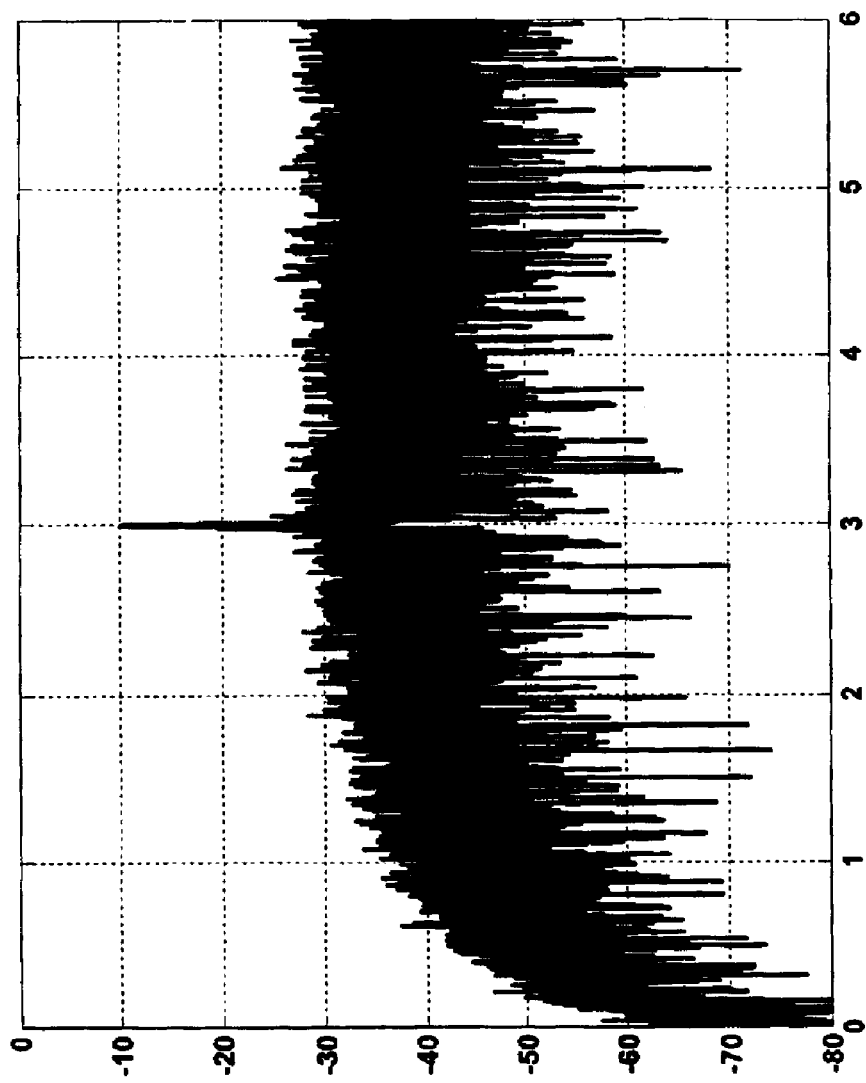
FIGS. 21–23 demonstrate the effectiveness of option 2 of the present invention in randomizing the quantization noise.
Figure 22:
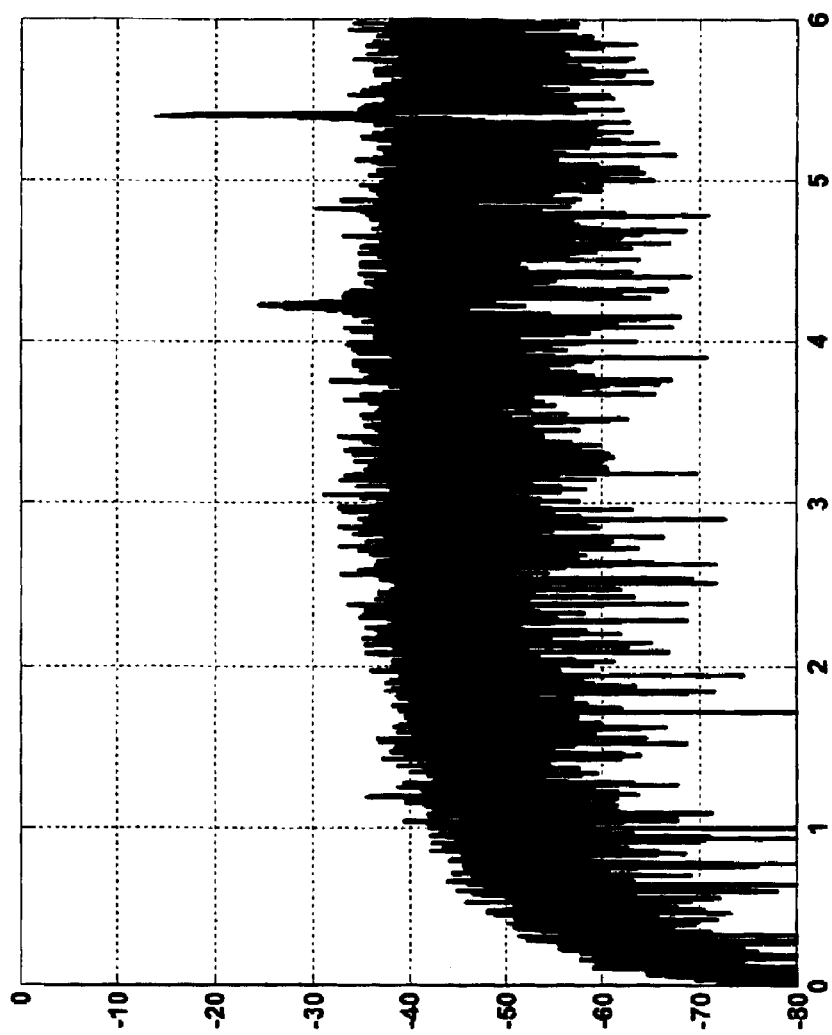
Figure 23:
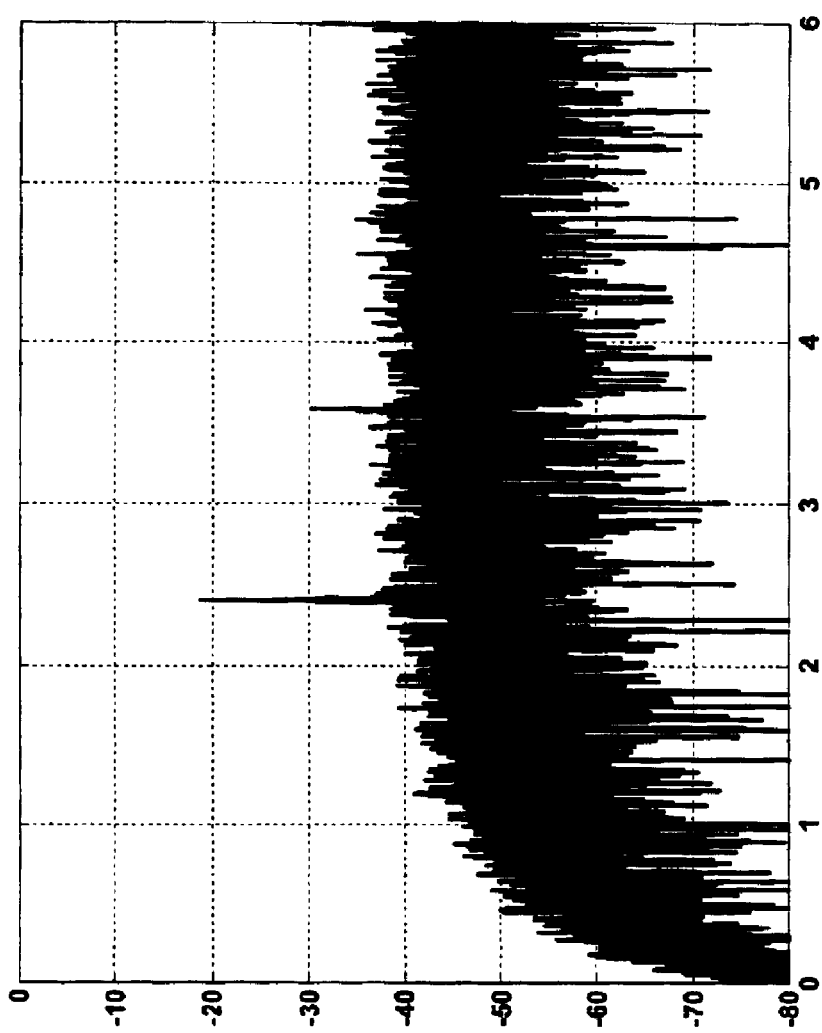

FIGS. 21–23 demonstrate the effectiveness of option 2 of the present invention in randomizing the quantization noise. Specifically, the CTΔΣADC of FIG. 9 employing dithering according to option 1, was driven by the same DC input signals as in FIGS. 4–6. Again, as for dithering according to option 1, in all cases, the spurious content of the quantization noise is strongly attenuated and the random nature of the quantization noise is highly independent of the particular input signal. FIGS. 21–23 illustrate that adding a random quantization noise in to the output of the quantizer in a feedback loop is also effective at reducing spurious tones if added with a high pass shaping function as in the case of the circuit of FIG. 19 or any circuit that produces a shaped response similar to that shown in FIG. 20.

Figure 24:
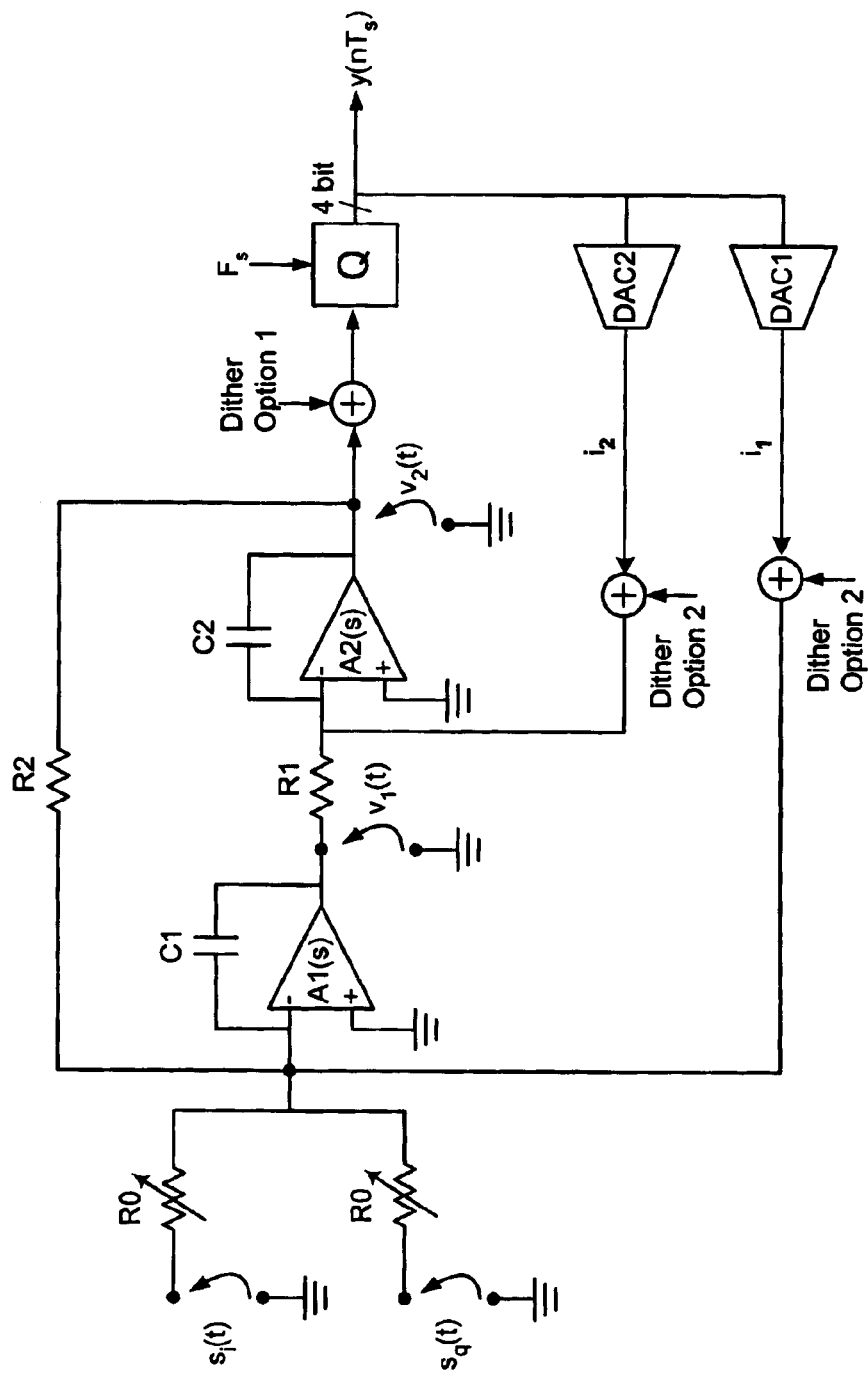
FIG. 24 shows the top-level diagram of an embodiment of the invention second order bandpass CTΔΣADC and hence includes two integrators, as discussed previously.

FIG. 24 shows the top-level diagram of an embodiment of the invention second order bandpass CTΔΣADC and hence includes two integrators, as discussed previously. Other components are resistors, a 4-bit quantizer clocked at 48 MHz, and two 4-bit feedback DACs. Component values for capacitors, resistors, and feedback DACs can be determined such that this CTΔΣADC has the property that quantization noise is rejected by NTF(s) around 2 MHz rather than at DC; it can be shown that the integrators along with resistors R1 and R2 form a resonator whose resonant frequency determines the center frequency for rejection of quantization noise at the CTΔΣADC output; hence the term bandpass CTΔΣADC. Generally, dither may be added through one of two options as with the first order CTΔΣADC of FIG. 10. The options and manner of adding the dither is the same as described above for the first order CTΔΣADC of FIG. 10.

Figure 25:
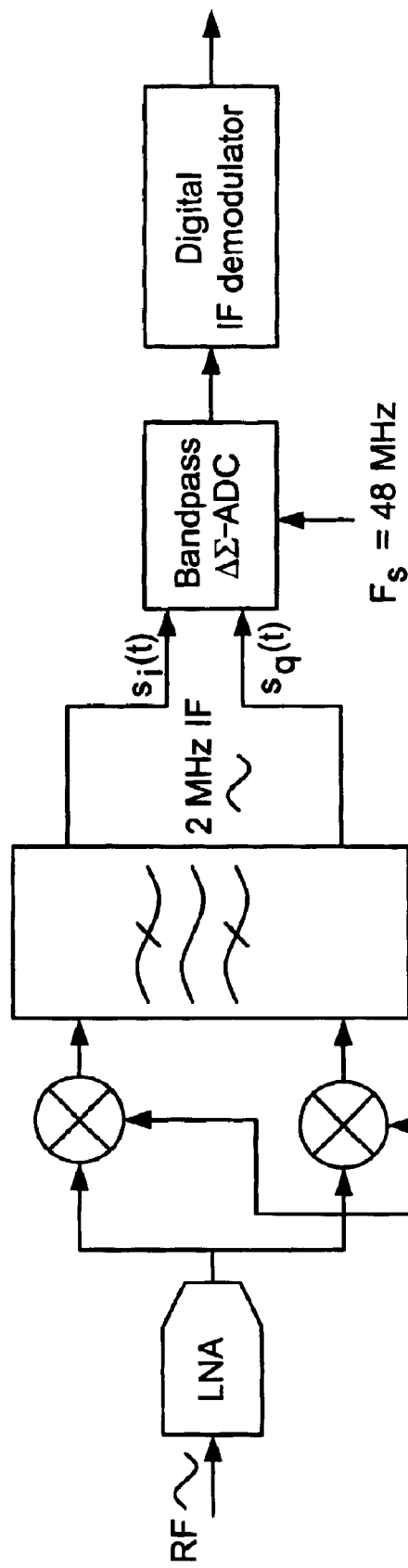
FIG. 25 shows the application of a second order CTΔΣADC in a radio receiver.

FIG. 25 shows the application of a second order CTΔΣADC in a radio receiver. As for the case of the simple first-order lowpass CTΔΣADC, two options for dither injection are proposed. Option 1 is identical to the method described previously. Option 2 also involves injecting a current in the feedback path as previously described, but now necessitates a digital bandpass shaping mechanism in order not to significantly degrade SNR as a result of dither injection.

Figure 26:
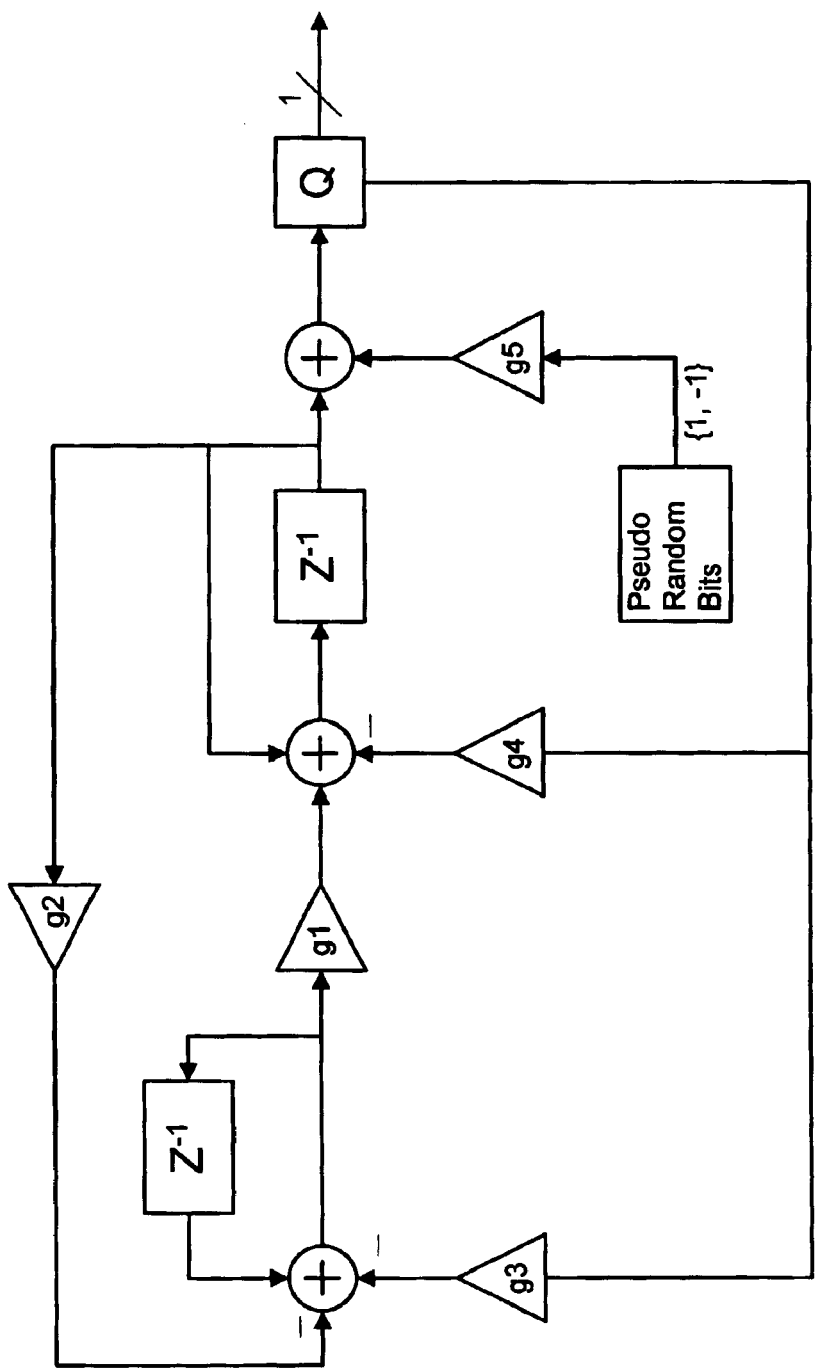
FIG. 26 shows the top level block diagram of a circuit for generating a bandpass shaped dither control signal s[n] appropriate for use in the bandpass CTΔΣADC; and, FIG. 27 shows a typical plot of the power spectral density of the output of the bandpass dither generator of FIG. 26.
Figure 27:
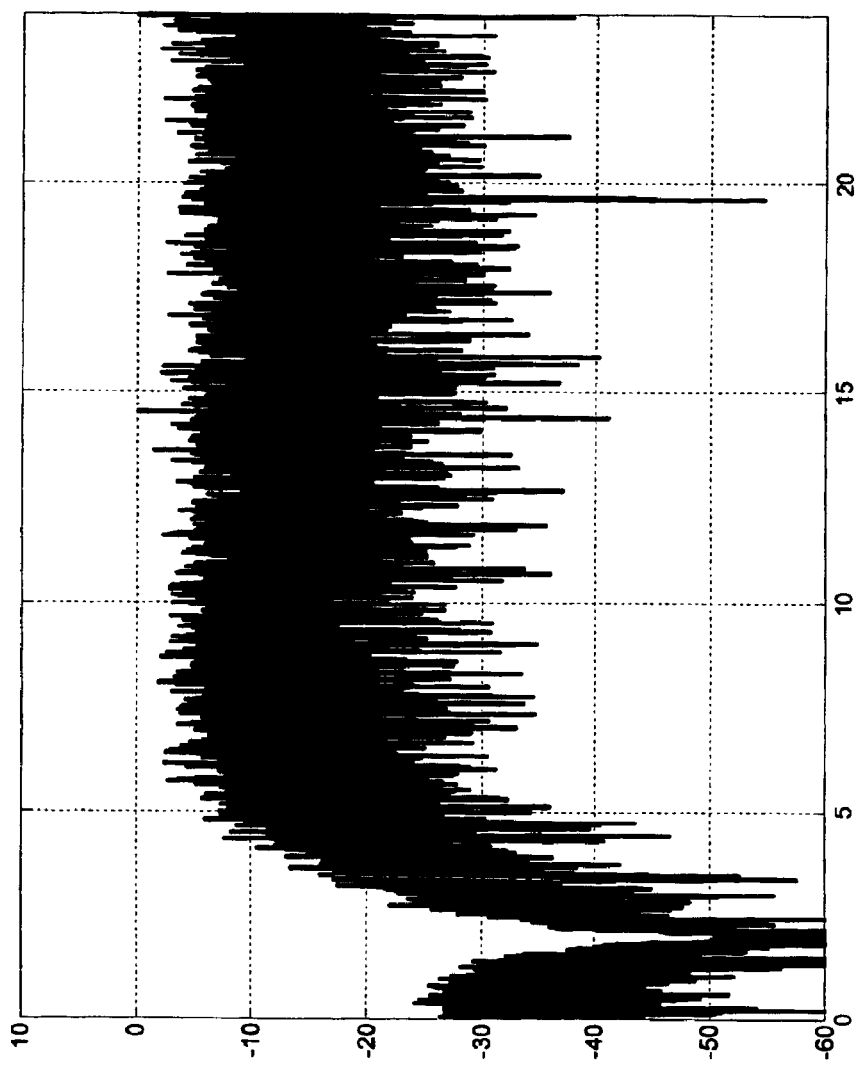

FIG. 26 shows the top level block diagram of a circuit for generating a bandpass shaped dither control signal s[n] appropriate for use in the bandpass CTΔΣADC. Clocked at 48 MHz, the circuit consists of two digital integrators, that—along with gain factors 'g1' and 'g2'—form a digital resonator that resonates at a frequency of interest effectively pushing random quantization noise away from a specified frequency of interest in both directions (to higher and to lower frequencies). Feedback through gain factors 'g3' and 'g4' generates a structure with rejection of quantization noise at an intermediate non-zero frequency. The input to this circuit is a pseudo random bit sequence, as generated by the circuit shown in FIG. 12. With the appropriate choice of gains 'g1'-'g4' this structure can generate a bandpass shaped dither control signal s[n] with arbitrary center frequency. FIG. 27 shows a typical plot of the power spectral density of the output of the bandpass dither generator of FIG. 26. With appropriate scaling, bandpass dither can be injected in the feedback path without significantly degrading the SNR performance of the CTΔΣADC. For the CTΔΣADC of FIG. 27, the appropriate set of coefficients would be such that quantization noise is rejected at 2 MHz as may be seen.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. An analog-to-digital converter (ADC) for producing coarse digital data based on the analog signals, wherein the ADC comprises:
    an integrator coupled to receive the analog signals to produce an integrated output;
    a quantizer coupled to receive the integrated output and for producing a digital value coarsely reflecting an amplitude of the integrated output based upon randomly fluctuating reference levels, the quantizer further comprising:
        a comparator module for comparing the randomly fluctuating reference levels to the integrated output and for producing the digital value; and
        a fluctuating reference level generator for generating the randomly fluctuating reference levels to the comparator module; and
    a digital-to-analog converter to convert the digital value to an analog feedback signal produced to the integrator.

2. The ADC of claim 1 wherein the quantizer further includes:
    a reference generator for providing a plurality of reference levels; and
    a multiplex module for selecting among the plurality of voltage reference levels to produce the randomly fluctuating reference levels based upon a pseudo-random sequence bit stream; and
    a pseudo-random sequence bit stream generator for generating the pseudo-random sequence bit stream to the multiplex module.

3. The ADC of claim 2 wherein the plurality of voltage references are produced by a voltage divider having at least two reference levels coupled to each multiplex module within the ADC.

4. The ADC of claim 1 wherein the comparator module further includes:

a plurality of comparators coupled to receive the randomly fluctuating reference levels wherein each of the plurality of comparators produces a binary signal indicating whether the integrated output magnitude exceeds the received randomly fluctuating reference level; and logic for receiving the binary signal produced by each of the plurality of comparators, the logic producing the digital value wherein the digital value reflects which of the plurality of comparators produced the binary signal as a logic "1" indicating that the integrated output exceeded the received fluctuating reference signal.

5. The ADC of claim 1 wherein the quantizer further includes a plurality of multiplex modules coupled to provide a selected voltage of at least two voltage levels to a corresponding comparator of a plurality of comparators within the comparator module wherein the selected voltage input is the randomly fluctuating reference level to which the integrated output voltage produced by the integrator is compared.

6. The ADC of claim 5 wherein each multiplexer module selects, based upon a pseudo-random sequence of bits produced by a pseudo-random sequence bit stream generator, which of the at least two voltages to provide as an input to a corresponding comparator of the plurality of comparators.

7. A quantizer within a continuous time delta sigma analog-to-digital converter, comprising:

a reference generator further for producing a first number of reference voltage levels for a second number of comparators;

voltage reference selection circuitry for selecting a second number of voltage levels from the first number of reference voltage levels for the second number of comparators;

a pseudo-random sequence bit generator for producing random control signals to the voltage reference selection circuitry wherein the voltage reference selection circuitry selects the second number of voltage levels based on the random control signals; and comparator circuitry for comparing the selected voltage levels to an input voltage to produce a digital signal having a value reflecting a magnitude of the input voltage.

8. The quantizer of claim 7 wherein at least six reference voltage levels are produced by the reference generator and wherein the voltage selection circuitry selects half of the at least six reference voltage levels for the second number of comparators.

9. A method for converting an analog signal to digital, comprising:

receiving an analog signal and a feedback signal;

integrating the analog signal;

quantizing an integrated analog signal;

converting a quantized signal into the feedback signal; and selecting and adding a dither signal based on a pseudo-random generator bit stream value to one of the integrated analog signal and the feeback signal.

10. The method of claim 9 wherein selecting a dither signal based on a pseudo-random generator bit stream value further includes selecting one of adding a dither voltage to the integrated analog signal or injecting a dither current into the feedback signal.

11. The method of claim 9, wherein injecting a dither current into the feedback signal further includes sinking a dither current from the feedback signal.

12. The method of claim 11 wherein injecting a dither current into the feedback signal includes sourcing a dither current into the feedback signal.

13. The method of claim 10 wherein selecting and adding a dither signal further includes shaping the dither signal as a high pass signal.

14. The method of claim 13 wherein a dither current is injected into a pair of feedback branches in a second order continuous time delta sigma analog to digital converter.

15. The method of claim 10 wherein selecting and adding a dither signal further includes shaping the dither signal as a bandpass shaped dither signal with a selected center frequency.

16. A radio transceiver, comprising:

front end transmitter circuitry for receiving digital data and for converting the digital data to outgoing analog signals, for upconverting the outgoing analog signals to RF signals, and for transmitting the RF signals;

front end receiver circuitry for receiving and down converting RF signals to incoming analog signals at one of an intermediate frequency and a baseband frequency; and at least one analog-to-digital converter (ADC) coupled to receive one of the outgoing and incoming analog signals (collectively "analog signals"), the ADC for producing coarse digital data based on the analog signals, wherein the ADC comprises:

an integrator coupled to receive the analog signals to produce an integrated output;

a quantizer for producing a digital output having a digital value coarsely reflecting an amplitude of the analog signals based upon randomly fluctuating reference levels, wherein the reference levels fluctuate based on a received pseudo-random sequence bit stream;

a digital-to-analog converter for converting the digital output to a feedback signal that is produced to the integrator;

a random signal generator for producing a pseudo-random sequence bit stream to be added to one of an input of the quantizer or to logic for shaping the noise from the, pseudo-random sequence prior to adding it to the feedback signal; and a digital-to-analog converter to convert the digital output to an analog feedback signal to produce a feedback to the integrator.

17. The radio transceiver of claim 16 wherein the quantizer further includes a plurality of multiplexer modules coupled to provide one of at least two voltage levels as a selected voltage input to a corresponding comparator of the plurality of comparators wherein the selected voltage input is the specified voltage to which the input voltage level is compared.

18. The radio transceiver of claim 16 wherein each multiplexer module selects, based upon the random sequence of bits, which of the at least two voltages to provide as an input to a corresponding comparator of the plurality of comparators.

19. A continuous time delta sigma analog to digital converter (CTΔΣADC), comprising:

means for producing fluctuating reference levels;

means for selecting a subset of the fluctuating reference levels;

means for comparing the subset of fluctuating reference levels to an analog input signal; and means for producing a digital value coarsely reflecting an amplitude of the analog input signal.

20. The CTΔΣADC of claim 19 wherein the means for comparing further includes a first plurality of comparators, each comparator having a voltage input coupled to a receive an input voltage and a quantizer input coupled to receive a fluctuating comparator reference level.

21. The CTΔΣADC of claim 19 wherein the means for comparing further includes a corresponding plurality of multiplexers, each multiplexer producing the fluctuating comparator reference level to the corresponding comparator based on a reference level selection signal, wherein each of the multiplexers is further coupled to receive at least two comparator reference levels.

22. A continuous time delta sigma analog to digital converter (CTΔΣADC), comprising:

means for producing a shaped noise current source;

means for converting an analog signal to a digital signal;

means for converting the digital signal to analog; and means for adding the shaped noise current source to an output of the means for converting the digital signal to analog.

23. The CTΔΣADC of claim 22 wherein the shaped noise current source is high pass shaped.

24. The CTΔΣADC of claim 22 wherein the shaped noise current source is band pass shaped.

* * * * *